(12) United States Patent
Lyden et al.

(10) Patent No.: US 8,791,754 B2
(45) Date of Patent: Jul. 29, 2014

(54) PROGRAMMABLE GAIN AMPLIFIER WITH AMPLIFIER COMMON MODE SAMPLING SYSTEM

(75) Inventors: Colin G. Lyden, Baltimore (IE);
Roberto S. Maurino, Turin (IT);
Damien J. McCartney, Raheen (IE)

(73) Assignee: Analog Devices, Inc., Norwood, MA (US)

( * ) Notice: Subject to any disclaimer, the term of this patent is extended or adjusted under 35 U.S.C. 154(b) by 30 days.

(21) Appl. No.: 13/592,074

(22) Filed: Aug. 22, 2012

(65) Prior Publication Data

US 2013/0293294 A1     Nov. 7, 2013

Related U.S. Application Data

(60) Provisional application No. 61/642,223, filed on May 3, 2012.

(51) Int. Cl.
*H03F 1/02*     (2006.01)
(52) U.S. Cl.
USPC ............................................. 330/9
(58) Field of Classification Search
USPC ........................ 330/9, 86; 327/124
See application file for complete search history.

(56) References Cited

U.S. PATENT DOCUMENTS

| | | | |
|---|---|---|---|
| 6,169,427 B1 | 1/2001 | Brandt | |
| 6,661,283 B1 | 12/2003 | Lee | |
| 7,038,532 B1 * | 5/2006 | Bocko et al. | 327/554 |
| 7,215,202 B2 | 5/2007 | Al-Shyoukh et al. | |
| 7,382,183 B2 | 6/2008 | Nolan et al. | |
| 7,548,115 B1 | 6/2009 | Liu | |
| 7,795,960 B2 | 9/2010 | Lyden et al. | |
| 2008/0297243 A1 | 12/2008 | Chen | |

OTHER PUBLICATIONS

C. Enz et al., "Circuit Techniques for Reducing the Effects of Op-Amp Imperfections: Autozeroing, Correlated Double Sampling and Chopper Stabilization," Proceedings of the IEEE, vol. 84, No. 11, pp. 1584-1614, Nov. 1996.
International Search Report and Written Opinion of the International Searching Authority in counterpart international application No. PCT/US2013/039475, report issued Sep. 5, 2013.

* cited by examiner

*Primary Examiner* — Steven J Mottola
(74) *Attorney, Agent, or Firm* — Kenyon & Kenyon LLP

(57) ABSTRACT

A programmable gain amplifier ("PGA") may include a differential amplifier, a pair of input capacitors, a pair of feedback capacitors provided in feedback configuration about the amplifier, a first chop circuit, provided at an input of the PGA and an output of the PGA and a second chop circuit provided at an output of the PGA. The PGA also may include circuit systems to sample voltages across the input capacitors in a sampling phase. The sampled voltages may correspond to a difference between a common mode voltage of input signals to the PGA and a common mode voltage of the differential amplifier. The sampled voltage, thus, defines a common mode voltage at the amplifier's inputs during other phases of operation, when the chop circuits are operational.

24 Claims, 8 Drawing Sheets

300

400

700

800

900

1000

1100

1200

1300

1400

PROGRAMMABLE GAIN AMPLIFIER WITH AMPLIFIER COMMON MODE SAMPLING SYSTEM

CROSS-REFERENCE TO RELATED APPLICATION

This application claims the benefit of priority afforded by provisional application Ser. No. 61/642,223, filed May 3, 2012, and entitled "Capacitive PGA".

BACKGROUND

The present invention relates to programmable gain amplifiers ("PGAs").

Low noise, low power and high accuracy PGAs can be implemented using a chopped differential amplifier with capacitors as feedback elements. This type of PGA is described in U.S. Pat. No. 7,795,960, which is assigned to Analog Devices, Inc., the assignee of the present invention. Capacitors do not transfer DC signals and, therefore, an input chop circuit converts an input DC signal into a square wave. The square wave is gained up by the amplifier with capacitive feedback. An output chop circuit then demodulates the amplified square wave back to a gained up DC signal. Low noise can be achieved because capacitors are noiseless and hence the differential amplifier is the only noise source in the PGA. Gain is accurately defined by the ratio of capacitors, which is stable and can be well controlled in integrated circuit ("IC") manufacturing processes. Programmable gain can be achieved by changing the values of the capacitors, e.g., by switching capacitors in or out of the amplifier circuit from a bank of capacitors.

Capacitive PGAs, however, do not naturally define the common mode of a voltage presented at the inputs of the differential amplifier, which should be matched to the common mode of the amplifier itself. In order to set this voltage, additional circuitry becomes necessarily required, which typically involves very large resistors and is thus intrinsically slow. Accordingly, the inventor perceives a need in the art for a PGA architecture that defines a common mode voltage at a differential amplifier with faster response than these prior attempts.

DETAILED DESCRIPTION

Embodiments of the present invention provide PGA architectures that include a differential amplifier, a pair of input capacitors, a pair of feedback capacitors provided in feedback configuration about the amplifier and first and second chop circuits, provided respectively at an input of the PGA and at an output of the PGA. The PGA may include a circuit system to sample voltages across the input capacitors during a sampling phase. The sampled voltages may correspond to a difference between a common mode voltage of input signals presented to the PGA and a common mode voltage of the differential amplifier. The sampled voltage, thus defines a common mode voltage at the amplifier's inputs during other phases of operation when the chop circuits are operational.

Figure 1:
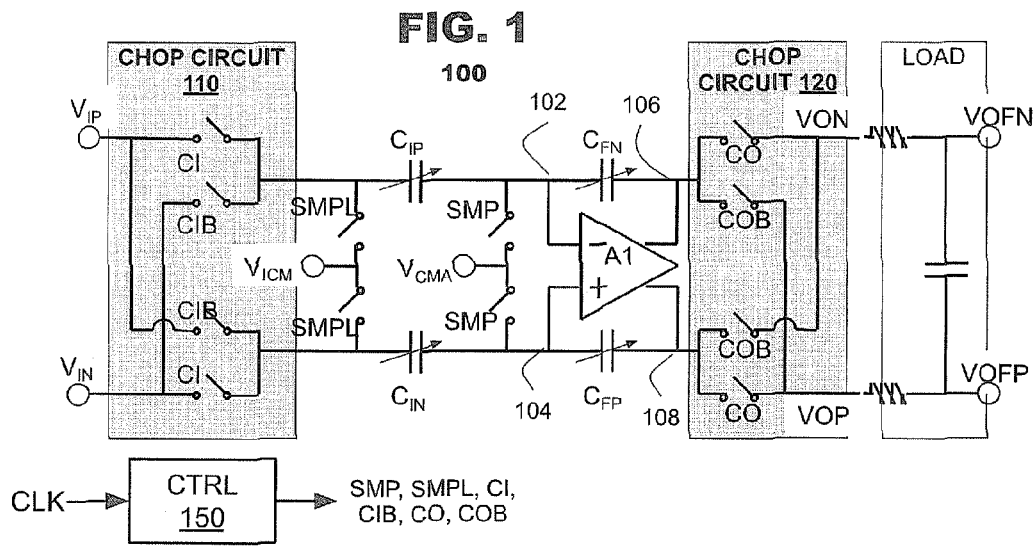
FIG. 1 illustrates a PGA according to an embodiment of the present invention.
Figure 2:
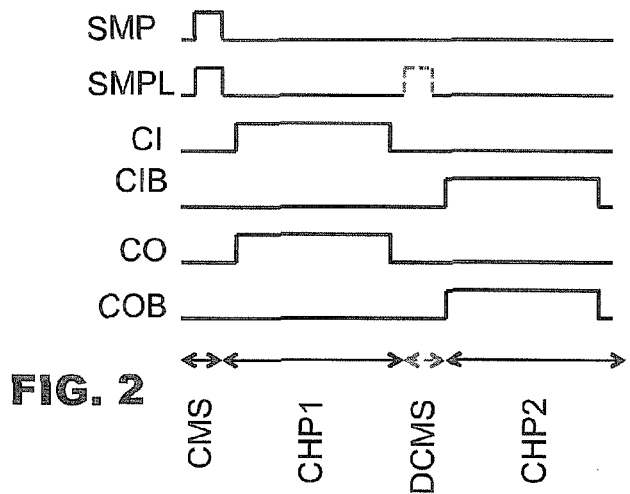
FIG. 2 is a timing diagram illustrating operation of the PGAs of FIGS. 1, 8 and 9 according to an embodiment of the present invention.

FIGS. 1 and 2

FIG. 1 illustrates a PGA 100 according to an embodiment of the present invention. The PGA may include a differential amplifier A1, a pair of variable input capacitors $C_{IN}$, $C_{IP}$, a pair of variable feedback capacitors $C_{FN}$, $C_{FP}$ and two chop switch circuits 110, 120. A first chop circuit 110 may be provided at an input to the PGA 100 and a second chop circuit 120 may be provided at an output of the PGA 100.

The first chop circuit 110 may connect a pair of differential input terminals $V_{IN}$, $V_{IP}$ of the PGA 100 respectively to first terminals of the input capacitors $C_{IN}$, $C_{IP}$ (called "input terminals," for convenience). Output terminals of the input capacitors $C_{IN}$, $C_{IP}$ ("output terminals") may be connected to input terminals 102, 104 of the amplifier A1. The feedback capacitors $C_{FN}$, $C_{FP}$ each may be coupled in a feedback configuration between respective outputs 106, 108 of the amplifier A1 and respective inputs 102, 104 of the amplifier A1. The amplifier outputs 106, 108 may be coupled to inputs of the second chop circuit 120. Outputs of the second chop circuit 120 may be coupled to output terminals VON, VOP of the PGA 100 and, further, to load devices and/or filter devices as may be desired (shown as "LOAD").

The chop circuits 110, 120 may configure orientation of signal flow about the amplifier A1. The chop circuits 110, 120 each may include an array of switches that selectively connect the inputs of the respective circuits to its outputs. Specifically, the first chop circuit 110 may include two pairs of switches controlled respectively by a control signal CI or CIB. One of the CI switches may connect an input terminal of the $C_{IP}$ capacitor to the $V_{IP}$ terminal and the other CI switch may connect an input terminal of $C_{IN}$ to the $V_{IN}$ terminal. One of the CIB switches may connect the input terminal of the $C_{IP}$ capacitor to the $V_{IN}$ terminal and the other CIB switch may connect the input terminal of $C_{IN}$ to the $V_{IP}$ terminal. The CI and CIB control signals may operate in complementary fashion during chop phases of operation of the PGA 100 (described below).

Similarly, the second chop circuit 120 may include two pairs of switches controlled respectively by a control signal CO or COB. One of the CO switches may connect an output terminal 106 of the amplifier A1 to the VON terminal and the other CO switch may connect an output terminal 108 of the amplifier A1 to the VOP terminal. One of the COB switches may connect the output terminal 106 to the VOP terminal and the other COB switch may connect the output terminal 108 to the VON terminal. The CO and COB control signals may operate in complementary fashion during chop phases of operation of the PGA 100 (described below).

The capacitors $C_{IP}$, $C_{IN}$, $C_{FN}$ and $C_{FP}$ may be variable capacitors. That is, each capacitor $C_{IP}$, $C_{IN}$, $C_{FN}$ and $C_{FP}$ may include an array of switched capacitor devices (not shown). During operation, the input capacitors $C_{IP}$, $C_{IN}$ may be set to have equal capacitance to each other and feedback capacitors $C_{FN}$, $C_{FP}$ may be set to have equal capacitance to each other. A ratio of capacitances between the input capacitors $C_{IP}/C_{IN}$ and the feedback capacitors $C_{FN}/C_{FP}$, however, may be controlled by control signals (not shown) to provide programmable gain of the PGA system 100.

The PGA 100 may include a pair of voltage sources $V_{ICM}$, $V_{CMA}$ coupled to the input capacitors $C_{IN}$, $C_{IP}$ by respective sampling switches. The voltage $V_{ICM}$ may be set to a common mode voltage of differential signals input to the PGA 100 at the $V_{IP}$, $V_{IN}$ terminals. The $V_{ICM}$ voltage source may be coupled to input terminals of the input capacitors $C_{IN}$, $C_{IP}$ via a pair of switches that close in response to a first control signal SMPL. The voltage $V_{CMA}$ may be set to a common mode voltage of the amplifier A1. The $V_{CMA}$ voltage source may be coupled to input terminals 102, 104 of the amplifier A1 (also output terminals of the input capacitors $C_{IP}$, $C_{IN}$) via second switches that close in response to a second control signal SMP.

The PGA 100 may include a controller 150 that generates control signals SMP, SMPL, CI, CIB, CO and COB to the PGA 100 in response to an external timing signal, such as a clock signal CLK.

FIG. 2 is a timing diagram illustrating operation of the PGA 100 according to an embodiment of the present invention. As illustrated, operation of the PGA 100 may occur over several phases, denoted "CMS," "CHP1," "CHP2" and an optional phase, labeled "DCMS." During the CMS phase, a common mode sampling phase, the PGA 100 may capture the common mode voltages $V_{ICM}$ and $V_{CMA}$. The SMP and SMPL switches may be closed, which may connect input terminals of the input capacitors $C_{IN}$, $C_{IP}$ to $V_{ICM}$ and output terminals of the capacitors $C_{IP}$, $C_{IN}$ to $V_{CMA}$. The switches of the chop circuits 110, 120 may be held open during the CMS phase, effectively disconnecting the capacitors $C_{IN}$, $C_{IP}$, $C_{FN}$ and $C_{FP}$ from other components of the PGA 100. Thus, each capacitor $C_{IN}$, $C_{IP}$ may store a voltage representing a difference between the common mode voltages of the two domains ($V_{CIN}=V_{CIP}=V_{ICM}-V_{CMA}$). The sampling operation may define the amplifier input common mode for the amplifier A1 and retain the common mode voltage persistent at the amplifier's inputs 102, 104 during other phases of operation.

During the first chop phase (CHP1), the chop circuits 110, 120 may be activated and the sample switches SMP, SMPL may be opened. The common mode voltage sources $V_{ICM}$, $V_{CMA}$ may be disconnected from the input capacitors $C_{IN}$, $C_{IP}$ by the sample switches SMP, SMPL. The CI control signal may cause its associated switches to be closed, thereby connecting the input signal at the $V_{IP}$ input to the input capacitor $C_{IP}$ and the input signal at the $V_{IN}$ input to the input capacitor $C_{IN}$. The CO control signal also may cause its associated switches to be closed, which may connect the feedback capacitor $C_{FN}$ to the output terminal VON and feedback capacitor $C_{FP}$ to the output terminal VOP. So configured, the PGA 100 may amplify a differential input signal presented as input voltages $V_{IP}$, $V_{IN}$ based on a ratio of the input capacitors $C_{IP}/C_{IN}$ to the amplifier feedback capacitors $C_{FN}/C_{FP}$.

The differential signals input to the $V_{IP}$, $V_{IN}$ terminals may vary about the common mode voltage $V_{ICM}$ of the PGA's predecessor circuit (not shown). Application of the differential signals to the input capacitors $C_{IP}$, $C_{IN}$ may cause counterpart voltages to be applied to the inputs 102, 104 of the amplifier A1 but at a common mode voltage $V_{CMA}$ of the amplifier A1 due to the voltages sampled on the input capacitors $C_{IP}$, $C_{IN}$ during the CMS phase.

During the second chop phase (CHP2), configuration of the chop circuits 110, 120 may be inverted. The sample switches SMP, SMPL may remain open, keeping the common mode voltage sources $V_{ICM}$, $V_{CMA}$ disconnected from the input capacitors $C_{IN}$, $C_{IP}$. The CIB control signal may cause its associated switches to be closed, thereby connecting the signal at input $V_{IP}$ to the input capacitor $C_{IN}$ and the signal at input $V_{IN}$ to the input capacitor $C_{IP}$. In this manner, the chop circuit 110 inverts distribution of the PGA input signals to the input terminals 102, 104 of the amplifier A1 as the PGA 100 transitions from the CHP1 phase to the CHP2 phase and inverts the distribution again as the PGA 100 transitions from the CHP2 phase to the CHP1 phase.

The COB control signal may cause its associated switches to be closed also, which may connect the amplifier output terminal 106 to output terminal VOP and the amplifier output terminal 108 to output terminal VON. As with the first chop circuit 110, the second chop circuit 120 may invert distribution of voltages from output terminals 106, 108 of the amplifier A1 to output terminals VON, VOP as the PGA 100 transitions from the CHP1 phase to the CHP2 phase and inverts them again as the PGA 100 transitions from the CHP2 phase to the CHP1 phase. Nevertheless, the PGA 100 amplifies a differential input signal presented as input voltages $V_{IP}$, $V_{IN}$ based on a ratio of the input capacitors $C_{IP}/C_{IN}$ to the amplifier feedback capacitors $C_{FN}/C_{FP}$.

As in the CHP1 phase, during the CHP2 phase, the input voltages $V_{IP}$, $V_{IN}$ may vary about the common mode voltage $V_{ICM}$ of the PGA's predecessor circuit (not shown). Application of the $V_{IP}$, $V_{IN}$ input voltages to the input capacitors $C_{IN}$, $C_{IP}$ may cause counterpart voltages to be applied to inputs of the amplifier A1 but shifted to the common mode voltage $V_{CMA}$ of the amplifier A1 due to the voltages sampled on the input capacitors $C_{IN}$, $C_{IP}$ during the CMS phase. Thus, the PGA 100 may perform a sampling operation during the CMS phase that may define a common mode for input signals presented to the amplifier A1 during the operational phases CHP1, CHP2 that matches to the amplifier's common mode.

In an embodiment, control signals CO and COB to the second chop circuit 120 may have a shorter duration than the control signals CI and CIB that are input to the first chop circuit 110. This may cause the output terminals VON, VOP to disconnect from output terminals of the amplifier A1 as the chop circuit transitions between the CHP1 and CHP2 phases and thereby reduces any glitches that otherwise might occur if the amplifier outputs were connected to the output terminals VON, VOP for the full duration of the CI, CIB signals.

In some cases, the CHP2 phase may follow the CHP1 phase immediately. Optionally, however, a "dummy common mode sampling" phase (DCMS) may be introduced between successive chop phases. The DCMS phase may provide symmetry in amplifier output signals during operation. During the DCMS phase, the SMPL signal may cause the input-side plates of input capacitors $C_{IP}$ and $C_{IN}$ to be connected to $V_{ICM}$. Closing the SMPL switches may cause the amplifier output to go to zero (neglecting A1 offset), which may cause output voltages at the onset of the CHP2 phase to have the same initial conditions as at the onset of the CHP1 phase. As illustrated in FIG. 2, the SMP signal may maintain its associated switches as open, those connected to $V_{CMA}$. In such circumstances, no sampling action occurs in the DCMS phase and, therefore, no additional kT/C noise is introduced to the PGA. At the end of phase CHP2, a new CMS phase can follow and the timing diagram may be repeated.

In another embodiment, a single CMS sampling phase can be followed by multiple chop phases (CHP1, CHP2). Dummy common mode sampling phases DCMS may be introduced between consecutive chop phases CHP2, CHP1 for better symmetry in the output signal. However, the common mode response of the circuit 100 is fastest if the common mode is resampled after the first CHP2 phase. Further, kT/C noise captured during CMS phase is upconverted at the chop frequency, which can be filtered out by post-processing circuitry (not shown).

Figure 3:
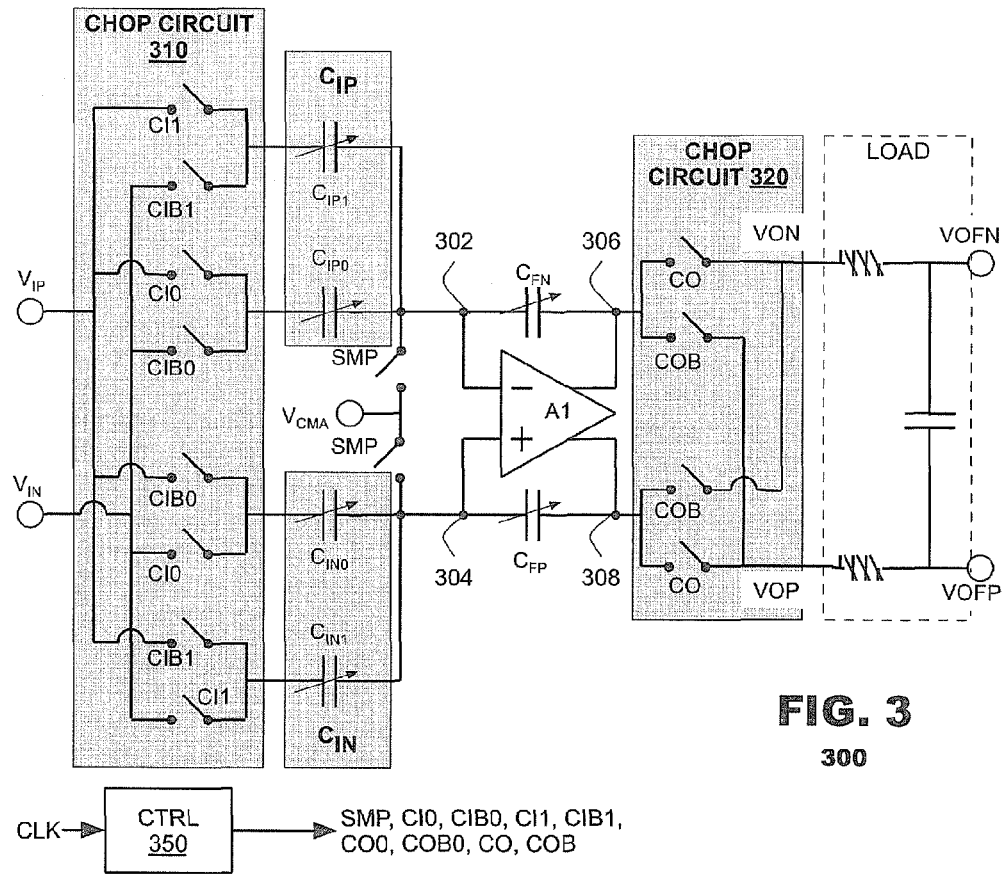
FIG. 3 illustrates a PGA according to another embodiment of the present invention.
Figure 4:
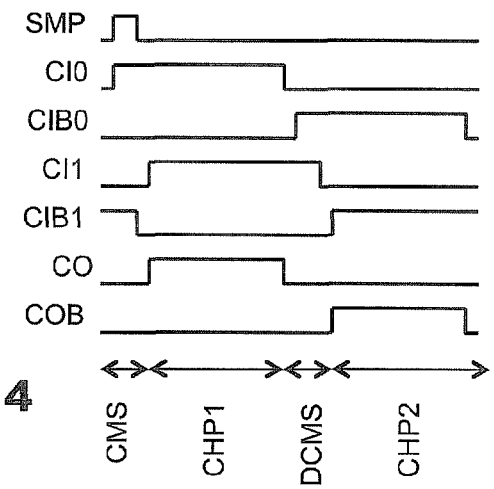
FIG. 4 is a timing diagram illustrating operation of the PGA of FIG. 3 according to an embodiment of the present invention.

FIGS. 3 and 4

FIG. 3 illustrates a PGA 300 according to another embodiment of the present invention. This embodiment avoids use of an input common mode voltage source ($V_{ICM}$) as in FIG. 1. In this embodiment, the PGA 300 may include a differential amplifier A1, a pair of variable input capacitors $C_{IN}$, $C_{IP}$, a pair of variable feedback capacitors $C_{FN}$, $C_{FP}$ and two chop switch circuits 310, 320. A first chop circuit 310 may be provided on an input to the PGA 300 and a second chop circuit 320 may be provided on an output of the PGA 300.

The capacitors $C_{IP}$, $C_{IN}$, $C_{FN}$ and $C_{FP}$ may be variable capacitors. That is, each capacitor $C_{IP}$, $C_{IN}$, $C_{FN}$ and $C_{FP}$ may include an array of capacitor devices with interconnecting switches (not shown) that selectively include capacitors from the array into or out of the PGA 300. During operation, the input capacitors $C_{IP}$, $C_{IN}$ may be set to have equal capacitance to each other and feedback capacitors $C_{FN}$, $C_{FP}$ may be set to have equal capacitance to each other. A ratio of capacitances between the input capacitors $C_{IP}/C_{IN}$ and the feedback capacitors $C_{FN}/C_{FP}$ may be controlled to provide programmable gain of the PGA system 300.

The PGA 300 may include a voltage source $V_{CMA}$ coupled to input terminals 302, 304 of the amplifier A1 and also to the input capacitors $C_{IN}$, $C_{IP}$ by respective sampling switches. The voltage $V_{CMA}$ may be set to a common mode voltage of the amplifier A1. The sampling switches may close in response to a control signal SMP.

In the illustrated embodiment, the input capacitors $C_{IN}$, $C_{IP}$ may be provided as pairs of sub-capacitors $C_{IN0}$, $C_{IN1}$, $C_{IP0}$ and $C_{IP1}$. The first chop circuit 310 may include four pairs of switches to connect the input terminals $V_{IN}$, $V_{IP}$ to input terminals of the $C_{IN0}$, $C_{IN1}$, $C_{IP0}$ and $C_{IP1}$ sub-capacitors. Within a first input capacitor $C_{IP}$, an input terminal of sub-capacitor $C_{IP0}$ may be connected to the $V_{PP}$, $V_{IN}$ terminals by a respective pair of switches, which are controlled respectively by complementary control signals CI0, CIB0. An input terminal of the counterpart sub-capacitor $C_{IP1}$ within $C_{IP}$ may be connected to the $V_{IP}$, $V_{IN}$ terminals by a second pair of switches, which are controlled respectively by a second set of complementary control signals CI1, CIB1. Output terminals of the $C_{IP0}$, $C_{IP1}$ sub-capacitors may be coupled to an inverting input 302 of the amplifier A1. Within the second input capacitor $C_{IN}$, an input terminal of the sub-capacitor $C_{IN0}$ may be connected to the $V_{IN}$, $V_{IP}$ terminals by a respective pair of switches, which are controlled respectively by the control signals CI0, CIB0. An input terminal of the counterpart sub-capacitor $C_{IN1}$ within $C_{IN}$ may be connected to the $V_{IN}$, $V_{IP}$ terminals by a second pair of switches, which are controlled respectively by the second set of complementary control signals CI1, CIB1. Output terminals of the $C_{IN0}$, $C_{IN1}$ sub-capacitors may be coupled to a non-inverting input 304 of the amplifier A1.

The feedback capacitors $C_{FN}$, $C_{FP}$ each may be coupled in a feedback configuration between one of the outputs 306, 308 of the amplifier A1 and its inputs 302, 304. The amplifier outputs 306, 308 may be coupled to inputs of the second chop circuit 320. Outputs of the second chop circuit 320 may be coupled to output terminals VON, VOP of the PGA 300 and, further, to load devices and/or filter devices as may be desired (LOAD).

The second chop circuit 320 may have two pairs of switches that are controlled by complementary control signals CO and COB. Switches controlled by the CO signal may connect a first output 306 of the amplifier A1 to output terminal VON and a second output 308 of the amplifier A1 to output terminal VOP. The switches controlled by the COB signal may connect the first output 306 of the amplifier A1 to output terminal VOP and the second output 308 of the amplifier A1 to output terminal VON.

The PGA 300 may include a controller 350 that generates control signals SMP, CI0, CIB0, CI1 CIB1, CO and COB to the PGA 300 in response to an external timing signal, such as a clock signal CLK.

FIG. 4 is a timing diagram illustrating operation of the PGA 300 according to an embodiment of the present invention. As illustrated, operation of the PGA 300 may occur over several phases of operation, CMS, CHP1, CHP2 and the optional DCMS phase. During the CMS phase, the PGA 300 signals SMP, CI0 and CIB1 may cause their respective switches to be closed. The SMP switches cause the output terminals of the $C_{IP}$ and $C_{IN}$ capacitors (including sub-capacitors $C_{IP0}$, $C_{IP1}$, $C_{IN0}$, $C_{IN1}$) to be connected to the amplifier common mode voltage $V_{CMA}$. The CI0 switches may cause input terminals of the $C_{IP0}$ and $C_{IN0}$ sub-capacitors to be connected to $V_{IP}$ and $V_{IN}$ respectively. The CIB1 switches may cause the $C_{IP1}$ and $C_{IN1}$ capacitors to be connected to $V_{IN}$ and $V_{IP}$ respectively. Thus, the $C_{IP0}$ and $C_{IN1}$ sub-capacitors may capture a voltage $V_{IP}-V_{CMA}$ during the CMS phase; and the $C_{IP1}$ and $C_{IN0}$ sub-capacitors may capture a voltage $V_{IN}-V_{CMA}$ during the CMS phase. The CO and COB control signals may cause the switches in the second chop circuit 320 to remain open during the CMS phase.

Thus, the PGA 300 may perform a sampling operation during the CMS phase that may define a common mode for input signals presented to the amplifier A1 during the operational phases CHP1, CHP2 that matches the amplifier's common mode.

During the first chop phase (CHP1), the CI0 and CI1 signals may cause their associated switches to be closed. The CIB0 and CIB1 signals may cause the switches to be open. These control signals cause input terminals of the $C_{IP}$ capacitor (including both sub-capacitors $C_{IP0}$, $C_{IP1}$) to be connected to the $V_{IP}$ input terminal and input terminals of the $C_{IN}$ capacitor (including both sub-capacitors $C_{IN0}$, $C_{IN1}$) to be connected to the $V_{IN}$ terminal. From a common mode perspective, charge redistribution between the $C_{IP}$ sub-capacitors $C_{IP0}$, $C_{IP1}$ may cause a voltage to be developed across the $C_{IP}$ capacitor as $\frac{1}{2}(V_{IP}-V_{IN})-V_{CMA}$, which corresponds to $V_{ICM}-V_{CMA}$. Similarly, charge redistribution between the $C_{IN}$ sub-capacitors $C_{IN0}$, $C_{IN1}$ may cause a voltage to be developed across the $C_{IN}$ capacitor as $V_{ICM}-V_{CMA}$. Thus, during the CHP1 phase, the amplifier A1 may be presented with an input signal that represents a difference between the $V_{IP}$ and $V_{IN}$ signals but shifted to the amplifier's common mode voltage $V_{CMA}$.

During the CHP1 phase, the CO signal may cause its associated switches to be closed, thereby connecting the amplifier output terminal 306 to the VON terminal and the amplifier output terminal 308 to the VOP terminal. The PGA 300, therefore, may generate a differential output voltage defined by the capacitances between the $C_{IP}/C_{IN}$ capacitors and the $C_{FN}/C_{FP}$ capacitors.

During the second chop phase (CHP2), the CIB1 and CIB0 signals may cause their associated switches to be closed. The CI0 and CI1 signals may cause their associated switches to be open. These control signals may cause input terminals of the $C_{IP}$ capacitor (including both sub-capacitors $C_{IP0}$, $C_{IP1}$) to be connected to the $V_{IN}$ input terminal and input terminals of the $C_{IN}$ capacitor (including both sub-capacitors $C_{IN0}$, $C_{IN1}$) to be connected to the $V_{IP}$ terminal. From a common mode perspective, as with phase CHP1, charge redistribution between the $C_{IP}$ sub-capacitors $C_{IP0}$, $C_{IP1}$ may cause a voltage to be developed across the $C_{IP}$ capacitor as $\frac{1}{2}(V_{IP}-V_{IN})-V_{CMA}$, which corresponds to $V_{ICM}-V_{CMA}$. Similarly, charge redistribution between the $C_{IN}$ sub-capacitors $C_{IN0}$, $C_{IN1}$ may cause a voltage to be developed across the $C_{IN}$ capacitor as $V_{ICM}-V_{CMA}$. Thus, during the CHP2 phase, the amplifier A1 may be presented with an input signal that represents a difference between the $V_{IP}$ and $V_{IN}$ signals but shifted to the amplifier's common mode voltage $V_{CMA}$.

During the CHP2 phase, the COB signal may cause its associated switches to be closed, thereby connecting the amplifier output terminal 306 to the VOP terminal and the amplifier output terminal 308 to the VON terminal. The PGA 300 may generate a differential output voltage defined by the capacitances between the $C_{IP}/C_{IN}$ capacitors and the $C_{FN}/C_{FP}$ capacitors.

In an embodiment, control signals CO and COB to the second chop circuit 320 may have a shorter duration than the control signals CI and CIB that are input to the first chop circuit 310. This may cause the output terminals VON, VOP to disconnect from output terminals of the amplifier A1 as the chop circuit transitions between the CHP1 and CHP2 phases and thereby reduces any glitches that otherwise might occur if the amplifier outputs were connected to the output terminals VON, VOP for the full duration of the CI, CIB signals.

In some cases, the CHP2 phase may follow the CHP1 phase immediately. Optionally, a dummy common mode sampling phase (DCMS) may be introduced between successive chop phases. The DCMS phase may provide symmetry in the amplifier's output signals during operation. During the DCMS phase, the CIB0 and CI1 signals may cause their associated switches to be closed while the CI0 and CIB1 signals may cause their switches to be open. The CIB0 switches may cause input terminals of the $C_{IP0}$ and $C_{IN0}$ sub-capacitors to be connected to $V_{IN}$ and $V_{IP}$ respectively. The CIB1 switches may cause input terminals of the $C_{IP1}$ and $C_{IN1}$ capacitors to be connected to $V_{IP}$ and $V_{IN}$, respectively. During the DCMS phase, however, the SMP switches and the switches of the chop circuit 320 are open. In such circumstances, no sampling action occurs in the DCMS phase and, therefore, no additional kT/C noise is introduced to the PGA Also, as in prior embodiments, a single CMS phase may be followed by multiple CHP1, CHP2 and, optionally, DCMS phases.

As indicated, the capacitors $C_{IP}$, $C_{IN}$, $C_{FN}$ and $C_{FP}$ may be variable capacitors and a ratio of capacitances between the $C_{IP}/C_{IN}$ capacitors and the $C_{FN}/C_{FP}$ capacitors may determine the gain that will be provided by the PGA 300. Each capacitor $C_{IP}$, $C_{IN}$, $C_{FN}$ and $C_{FP}$ may be provided as an array of capacitor devices with interconnecting switches (not shown) that selectively include capacitors from the array into or out of the PGA 300. During the CMS phase, the $C_{IP0}$, $C_{IP1}$, $C_{IN0}$ and $C_{IN1}$ capacitances may be set to be equal to each other. Thus, when capacitors from the $C_{IP}$ and $C_{IN}$ capacitor arrays are selected to set the PGA's amplification, half of the selected capacitors may be provided to form the $C_{IP1}$ and $C_{IN1}$ sub-capacitors and the other half of the selected capacitors may form the $C_{IP0}$ and $C_{IN0}$ sub-capacitors.

FIGS. 5-7

Figure 5:
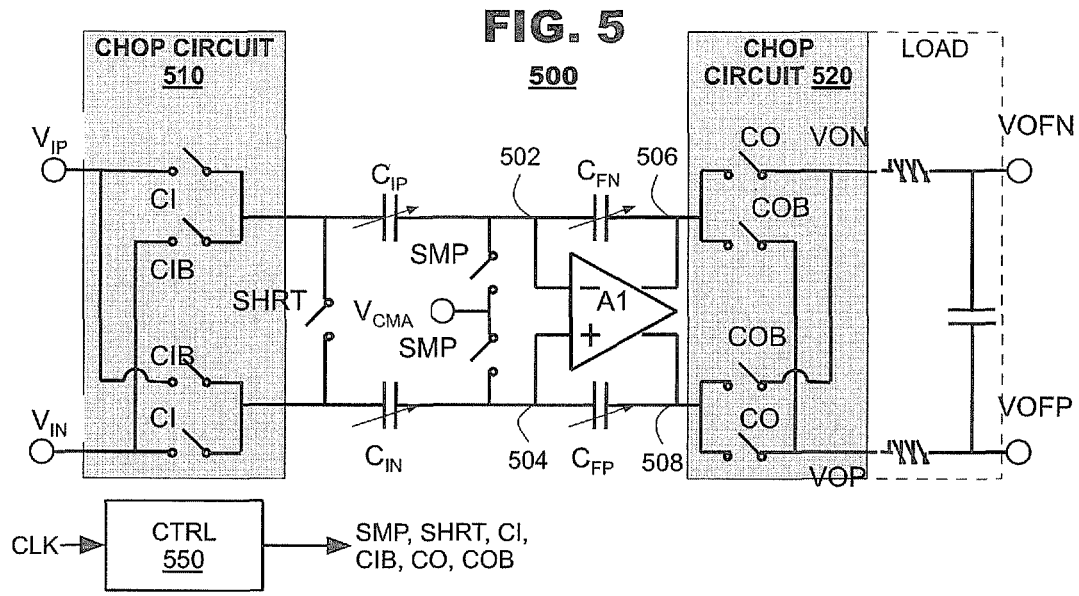
FIG. 5 illustrates a PGA according to a further embodiment of the present invention.

FIG. 5 illustrates a PGA 500 according to another embodiment of the present invention. This embodiment also avoids use of a voltage source $V_{ICM}$ (FIG. 1) to provide an input common mode voltage to the PGA 500. In this embodiment, the PGA 500 may include a differential amplifier A1, a pair of variable input capacitors $C_{IN}$, $C_{IP}$, a pair of variable feedback capacitors $C_{FN}$, $C_{FP}$ and two chop switch circuits 510, 520. A first chop circuit 510 may be provided at an input to the PGA 500 and a second chop circuit 520 may be provided at an output of the PGA 500. The PGA 500 also may include a switch connected between input terminals of the two input capacitors $C_{IN}$, $C_{IP}$ that is activated by a control signal labeled SHRT.

The chop circuits 510, 520 each may include an array of switches that selectively connect the inputs of the respective circuits to its outputs. Specifically, the chop circuit 510 may include two pairs of switches controlled respectively by a control signal CI or CIB. The CI switches may connect an input terminal of the $C_{IP}$ capacitor to $V_{IP}$ and may connect an input terminal of the $C_{IN}$ capacitor to the $V_{IN}$ terminal. The CIB switches may connect the input terminal of the $C_{IP}$ capacitor to $V_{IN}$ and may connect the input terminal of the $C_{IN}$ capacitor to $V_{IP}$.

Similarly, the chop circuit 520 may include two pairs of switches controlled respectively by a control signal CO or COB. The CO switches may connect a first output terminal 506 of the amplifier A1 to PGA output terminal VON and may connect a second output terminal 508 of the amplifier A1 to output terminal VOP. The COB switches may connect the first output terminal 506 to output terminal VOP and may connect the second output terminal 508 to output terminal VON.

The capacitors $C_{IP}$, $C_{IN}$, $C_{FN}$ and $C_{FP}$ may be variable capacitors. That is, each capacitor $C_{IP}$, $C_{IN}$, $C_{FN}$ and $C_{FP}$ may include an array of capacitor devices with interconnecting switches (not shown) that selectively include capacitors from the array into or out of the PGA 500. During operation, the input capacitors $C_{IP}$, $C_{IN}$ may be set to have equal capacitance to each other and the feedback capacitors $C_{FN}$, $C_{FP}$ may be set to have equal capacitance to each other. A ratio of capacitances between the input capacitors $C_{IP}/C_{IN}$ and the feedback capacitors $C_{FN}/C_{FP}$ may be controlled to provide programmable gain of the PGA system 500.

The PGA 500 may include a voltage source $V_{CMA}$ coupled to input terminals 502, 504 of the amplifier A1 and also to the output terminal of the input capacitors $C_{IN}$, $C_{IP}$ by respective sampling switches. The voltage $V_{CMA}$ may be set to a common mode voltage of the amplifier A1. The sampling switches may close in response to a control signal SMP.

The PGA 500 may include a controller 550 that generates control signals SMP, SHRT, CI, CIB, CO and COB to the PGA 500 in response to an external timing signal, such as a clock CLK signal.

Figure 6:
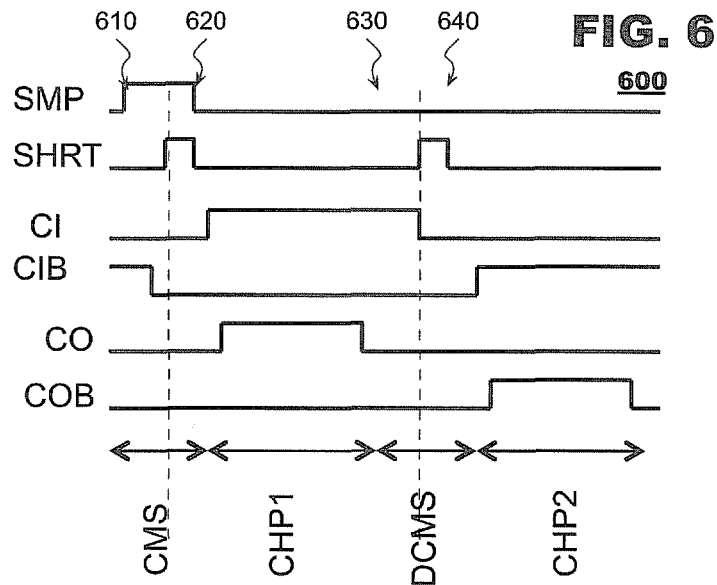
FIG. 6 is a timing diagram illustrating operation of the PGA of FIG. 5 according to an embodiment of the present invention.

FIG. 6 is a timing diagram illustrating operation of the PGA 500 according to an embodiment of the present invention. As illustrated, operation of the PGA 500 may occur over several phases of operation, CMS, CHP1, CHP2 and the optional DCMS phase. In this embodiment, operation of the CMS phase may proceed in a pair of sub-phases. During a first sub-phase 610 of the CMS phase, the signals SMP and CIB may cause their respective switches to be closed. The SMP switches cause the output terminals of the $C_{IP}$ and $C_{IN}$ capacitors to be connected to the amplifier common mode voltage $V_{CMA}$. The CIB switches may cause the input terminal of the $C_{IP}$ capacitor to be connected to $V_{IN}$ and the input terminal of the $C_{IN}$ capacitor to be connected to $V_{IP}$. Thus, the $C_{IP}$ capacitor may capture a voltage $V_{IN}$–$V_{CMA}$ during the first sub-phase 610 and the $C_{IN}$ capacitor may capture a voltage $V_{IP}$–$V_{CMA}$ during the first sub-phase of CMS.

During the second sub-phase 620, the CIB and SHRT signals both may transition. The transition of the CIB may cause its associated switches to be open, effectively disconnecting the input terminals of the $C_{IP}$ and $C_{IN}$ capacitors from the $V_{IN}$ and $V_{IP}$ terminals. The transition of the SHRT signal may cause the input terminals of the $C_{IP}$ and $C_{IN}$ capacitors to be connected to each other. Charge redistribution may occur between the $C_{IP}$ and $C_{IN}$ capacitors which may cause voltages to be developed across each capacitor as $\frac{1}{2}(V_{IP}-V_{IN})-V_{CMA}$, corresponding to $V_{ICM}$–$V_{CMA}$. Thus, the PGA 500 may perform a sampling operation during the CMS phase that may define a common mode for input signals presented to the amplifier A1 during the chop phases CHP1, CHP2 that matches to the amplifier's common mode.

During the first chop phase (CHP1), the SMP and SHRT signals both may transition. Transition of the SHRT signal may cause its switch to be open, which disconnects input terminals of the $C_{IP}$ and $C_{IN}$ capacitors from each other. Charge across the $C_{IP}$ and $C_{IN}$ capacitors may be trapped. Transition of the SMP signal may disconnect the output terminals of the $C_{IP}$ and $C_{IN}$ capacitors and the amplifier's inputs from the amplifier common mode voltage source $V_{CMA}$.

The CI signal may cause its associated switches to be closed and the CIB signal may cause its switches to be open. These control signals may cause input terminals of the $C_{IP}$ capacitor to be connected to the $V_{IP}$ input terminal and input terminals of the $C_{IN}$ capacitor to be connected to the $V_{IN}$ terminal. Differential voltages present at the $V_{IP}$ and $V_{IN}$ terminals may be presented to inputs of the amplifier A1 but shifted from a common mode level of the input signals ($V_{ICM}$) to the common mode level of the amplifier A1 ($V_{CMA}$). The amplifier A1 may generate differential voltages at amplifier output terminals 506, 508 based on the ratio of the capacitances between the $C_{IP}/C_{IN}$ capacitors and the $C_{FN}/C_{FP}$ capacitors.

During the CHP1 phase, the CO signal may cause its associated switches to be closed, thereby connecting the amplifier output terminal 506 to the VON terminal and the amplifier output terminal 508 to the VOP terminal.

During the second chop phase (CHP2), the CI and CO signals may cause their associated switches to be open. The CIB signal may cause its associated switches to be closed, which may cause the input terminal of the $C_{IP}$ capacitor to be connected to the $V_{IN}$ input terminal and input terminal of the $C_{IN}$ capacitor to be connected to the $V_{IP}$ terminal. Again, the differential voltages present at the $V_{IP}$ and $V_{IN}$ terminals may be presented to inputs of the amplifier A1 but shifted from a common mode level of the input signals ($V_{ICM}$) to the common mode level of the amplifier A1 ($V_{CMA}$) in an orientation that is inverted with respect to the orientation of the CHP1 phase. The amplifier A1 may generate differential voltages at amplifier output terminals 506, 508 based on the ratio of the capacitances between the $C_{IP}/C_{IN}$ capacitors and the $C_{FN}/C_{FP}$ capacitors.

During the CHP2 phase, the orientation of the second chop circuit 520 may be inverted with respect to its orientation during the CHP1 phase. Specifically, the COB phase may cause its switches to be closed and the CO phase may cause its switches to be open. The amplifier output terminal 506 may be connected to the VOP terminal and the amplifier output terminal 508 may be connected to the VON terminal.

As in the prior embodiments, in some cases, the CHP2 phase may follow the CHP1 phase immediately. Optionally, a dummy common mode sampling phase (DCMS) may be introduced between successive chop phases. The DCMS phase may provide symmetry in the amplifier's output signals during operation. In the embodiment of FIGS. 5 and 6, the DCMS phase may have two sub-phases 630 and 640. During the first sub-phase 630, the CIB signal may cause their associated switches to be open but the CI signal may cause their switches to be closed. The CI switches may cause the input terminal of the $C_{IP}$ capacitor to be connected to $V_{IP}$ and the input terminal of the $C_{IN}$ capacitor to be connected to $V_{IN}$. The sample signal SMP, however, may cause its associated switches to be open. Accordingly, although the input terminals of the $C_{IP}$ and $C_{IN}$ are exposed to the voltages present at the input terminals $V_{IN}$ and $V_{IP}$ the voltages across the input capacitors $C_{IP}$ or $C_{IN}$ do not change.

During the second sub-phase 640, the CI and SHRT signals both may transition. The transition of the CI signal may cause its associated switches to be open, which disconnects the input terminals of the $C_{IP}$ and $C_{IN}$ capacitors from the $V_{IP}$ and $V_{IN}$ terminals. The transition of the SHRT signal may cause the input terminals of the $C_{IP}$ and $C_{IN}$ capacitors to be connected to each other. Because the SMP switch is not closed, there is no charge redistribution between $C_{IP}$ and $C_{IN}$. Closing the SHRT switch forces the voltages at the terminal input to become equal to $V_{ICM}$ (and the differential voltage across the input terminals of $C_{IP}$ and $C_{IN}$ to be zero). But the charge from $C_{IP}$ and $C_{IN}$ is transferred to the feedback capacitor $C_{FP}$ and $C_{FN}$. Such operations may provide symmetry during operation with the input terminals of $C_{IP}$ and $C_{IN}$ at $V_{ICM}$, the output of the amp A1 should go to the output common mode voltage, so the voltage on nodes 508 and 506 should be equal to the output common mode. This should mimic what happens during the CMS phase. Again, the SMP may be kept low during the DCMS and, hence, no sampling should occur and, therefore, no additional kT/C noise should be added to the PGA's output.

As in prior embodiments, the capacitors $C_{IP}$, $C_{IN}$, $C_{FN}$ and $C_{FP}$ may be variable capacitors and a ratio of capacitances between the $C_{IP}/C_{IN}$ capacitors and the $C_{FN}/C_{FP}$ capacitors may determine the gain that will be provided by the PGA 500. Each capacitor $C_{IP}$, $C_{IN}$, $C_{FN}$ and $C_{FP}$ may be provided as an array of capacitor devices with interconnecting switches (not shown) that selectively include capacitors from the array into or out of the PGA 500. During the CMS phase, the $C_{IP0}$, $C_{IP1}$, $C_{IN0}$ and $C_{IN1}$ capacitances may be set to be equal to each other. Thus, when capacitors from the $C_{IP}$ and $C_{IN}$ capacitor arrays are selected to set the PGA's amplification, half of the selected capacitors may be provided to form the $C_{IP1}$ and $C_{IN1}$ sub-capacitors and the other half of the selected capacitors may form the $C_{IP0}$ and $C_{IN0}$ sub-capacitors.

Figure 7:
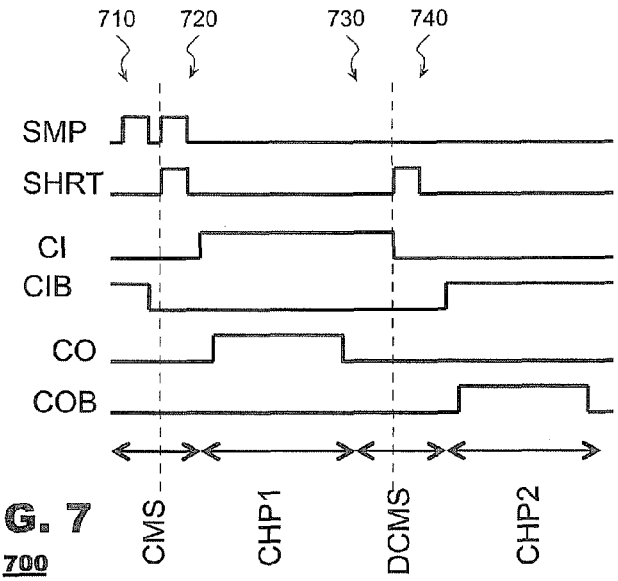
FIG. 7 is a timing diagram illustrating operation of the PGA of FIG. 5 according to another embodiment of the present invention.

FIG. 7 is a timing diagram illustrating operation of the PGA 500 according to another embodiment of the present invention. As in the prior embodiments, operation of the PGA 500 may occur over several phases of operation, CMS, CHP1, CHP2 and the optional DCMS phase. Here, operation of the CMS phase may proceed in a pair of sub-phases 710, 720. During a first sub-phase 710 of the CMS phase, the SMP and CIB signals may cause their respective switches to be closed.

The SMP switches may cause the output terminals of the $C_{IP}$ and $C_{IN}$ capacitors to be connected to the amplifier common mode voltage $V_{CMA}$. The CIB switches may cause the input terminal of the $C_{IP}$ capacitor to be connected to $V_{IN}$ and the input terminal of the $C_{IN}$ capacitor to be connected to $V_{IP}$. Thus, the $C_{IP}$ capacitor may capture a voltage $V_{IN}$-$V_{CMA}$ during the first sub-phase 710 and the $C_{IN}$ capacitor may capture a voltage $V_{IP}$-$V_{CMA}$ during the first sub-phase of CMS.

The SMP and CIB signals may transition toward the end of the first sub-phase 710 to open their associated switches. In this embodiment, the falling edge of the SMP signal may precede the falling edge of the CIB signal (the timing difference is not perceptible at the scale shown in FIG. 7). Because the CIB signal drives switches that are connected to the input signal (terminals $V_{IP}$, $V_{IN}$), input signal-dependent charge injection errors may be captured by the input capacitors $C_{IP}$ and $C_{IN}$ if the SMP switches were open at the time the CIB switches open. By having the falling edge of SMP precede the edge of CIB, the embodiment of FIG. 7 may avoid capture of such charge injection errors at the conclusion of the first sub-phase 710.

During the second sub-phase 720 of CMS, the SMP and SHRT signals may cause their associated switches to be closed. Control signals CI, CIB to the first chop switch 510 may cause the input capacitors $C_{IP}$, $C_{IN}$ to be disconnected from the input terminals $C_{IP}$, $C_{IN}$. Charge redistribution may occur between the $C_{IP}$ and $C_{IN}$ capacitors which may cause voltages to be developed across each capacitor as ½($V_{IP}$-$V_{IN}$)-$V_{CMA}$, which corresponds to $V_{ICM}$-$V_{CMA}$.

The SMP and SHRT signals may transition toward the end of the second sub-phase 720, with the falling edge of the SMP signal preceding the falling edge of the SHRT signal by a slight amount (again, the timing difference is not perceptible at the scale shown in FIG. 7). By having the falling edge of SMP precede the falling edge of SHRT, the embodiment of FIG. 7 may avoid capture of charge injection errors that otherwise would depend on the $V_{ICM}$-$V_{CMA}$ voltages present on the input capacitors $C_{IP}$, $C_{IN}$.

During the first chop phase (CHP1), the CI and CO signals both may transition. The CI signal may cause its associated switches to be closed and the CIB signal may cause its switches to be open. These control signals may cause input terminals of the $C_{IP}$ capacitor to be connected to the $V_{IP}$ input terminal and input terminals of the $C_{IN}$ capacitor to be connected to the $V_{IN}$ terminal. Differential voltages present at the $V_{IP}$ and $V_{IN}$ terminals may be presented to inputs of the amplifier A1 but shifted from a common mode level of the input signals ($V_{ICM}$) to the common mode level of the amplifier A1. The amplifier A1 may generate differential voltages at amplifier output terminals 506, 508 based on the ratio of the capacitances between the $C_{IP}$/$C_{IN}$ capacitors and the $C_{FN}$/$C_{FP}$ capacitors.

During the CHP1 phase, the CO signal may cause its associated switches to be closed, thereby connecting the amplifier output terminal 506 to the VON terminal and the amplifier output terminal 508 to the VOP terminal.

During the second chop phase (CHP2), the CI and CO signals may cause their associated switches to be open. The CIB signal may cause its associated switches to be closed. The input terminal of the $C_{IP}$ capacitor may be connected to the $V_{IN}$ input terminal and input terminal of the $C_{IN}$ capacitor may be connected to the $V_{IP}$ terminal. Again, the differential voltages present at the $V_{IP}$ and $V_{IN}$ terminals may be presented to inputs of the amplifier A1 but shifted from a common mode level of the input signals ($V_{ICM}$) to the common mode level of the amplifier A1 in an orientation that is inverted with respect to the orientation of the CHP1 phase. The amplifier A1 may generate differential voltages at terminals 506, 508 based on the ratio of the capacitances between the $C_{IP}$/$C_{IN}$ capacitors and the $C_{FN}$/$C_{FP}$ capacitors.

During the CHP2 phase, the orientation of the second chop circuit 520 may be inverted with respect to its orientation during the CHP1 phase. Specifically, the COB phase may cause its switches to be closed and the CO phase may cause its switches to be open. The amplifier output terminal 506 may be connected to the VOP terminal and the amplifier output terminal 508 may be connected to the VON terminal.

As in the prior embodiments, in some cases, the CHP2 phase may follow the CHP1 phase immediately. Optionally, a dummy common mode sampling phase (DCMS) may be introduced between successive chop phases. The DCMS phase may provide symmetry in the amplifier's output signals during operation. In the embodiment of FIGS. 5 and 7, the DCMS phase may have two sub-phases 730 and 740. During the first sub-phase 730, the CIB signal may cause its associated switches to be open but the CI signal may cause its switches to be closed. The CI switches may cause the input terminal of the $C_{IP}$ capacitor to be connected to $V_{IP}$ and the input terminal of the $C_{IN}$ capacitor to be connected to $V_{IN}$. The sample signal SMP, however, may cause its associated switches to be open. Accordingly, although the input terminals of the $C_{IP}$ and $C_{IN}$ are exposed to the voltages present at the input terminals $V_{IN}$ and $V_{IP}$, the voltages across the input capacitors $C_{IP}$ or $C_{IN}$ do not change.

During the second sub-phase 740, the CI and SHRT signals both may transition. The transition of the CI signal may cause its associated switches to be open, which disconnects the input terminals of the $C_{IP}$ and $C_{IN}$ capacitors from the $V_{IP}$ and $V_{IN}$ terminals. The transition of the SHRT signal may cause the input terminals of the $C_{IP}$ and $C_{IN}$ capacitors to be connected to each other. Shorting the input terminals of $C_{IP}$ and $C_{IN}$ together sets the voltage at the input terminals of $C_{IP}$ and $C_{IN}$ to $V_{ICM}$ and the differential voltage at the input terminals of $C_{IP}$ and $C_{IN}$ to be zero. As in the foregoing embodiments, the DCMS phase may provide signal symmetry without adding kT/C noise.

As in prior embodiments, the capacitors $C_{IP}$, $C_{IN}$, $C_{FN}$ and $C_{FP}$ may be variable capacitors and a ratio of capacitances between the $C_{IP}$/$C_{IN}$ capacitors and the $C_{FN}$/$C_{FP}$ capacitors may determine the gain that will be provided by the PGA 500. Each capacitor $C_{IP}$, $C_{IN}$, $C_{FN}$ and $C_{FP}$ may be provided as an array of capacitor devices with interconnecting switches (not shown) that selectively include capacitors from the array into or out of the PGA 500. During the CMS phase, the $C_{IP0}$, $C_{IP1}$, $C_{IN0}$ and $C_{IN1}$ capacitances may be set to be equal to each other. Thus, when capacitors from the $C_{IP}$ and $C_{IN}$ capacitor arrays are selected to set the PGA's amplification, half of the selected capacitors may be provided to form the $C_{IP1}$ and $C_{IN1}$ sub-capacitors and the other half of the selected capacitors may form the $C_{IP0}$ and $C_{IN0}$ sub-capacitors.

FIG. 8

Figure 8:
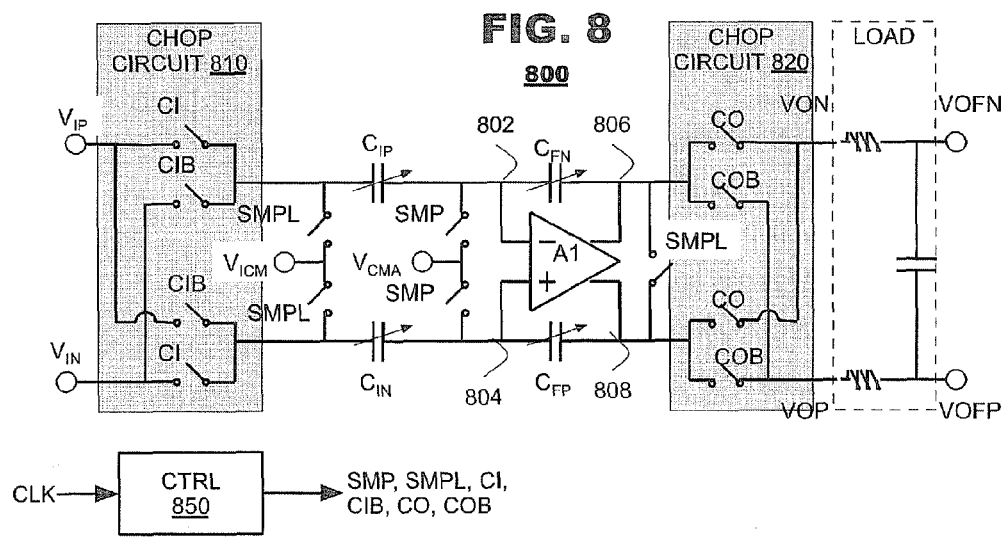
FIG. 8 illustrates a PGA according to another embodiment of the present invention.

FIG. 8 illustrates a PGA 800 according to another embodiment of the present invention. The PGA 800 may include a differential amplifier A1, a pair of variable input capacitors $C_{IN}$, $C_{IP}$, a pair of variable feedback capacitors $C_{FN}$, $C_{FP}$ and two chop switch circuits 810, 820. In the embodiment of FIG. 8, the differential amplifier A1 may be provided as an operational transconductance amplifier ("OTA"). A first chop circuit 810 may be provided on an input to the PGA 800 and a second chop circuit 820 may be provided on an output of the PGA 800. The first chop circuit 810 may connect a pair of differential input terminals $V_{IN}$, $V_{IP}$ of the PGA 800 respectively to input terminals of the input capacitors $C_{IN}$, $C_{IP}$.

Output terminals of the input capacitors $C_{IN}$, $C_{IP}$ may be connected to input terminals of the amplifier A1. The feedback capacitors $C_{FN}$, $C_{FP}$ each may be coupled in a feedback configuration between respective outputs 806, 808 of the amplifier A1 and the amplifier's inputs. The amplifier outputs 806, 808 may be coupled to inputs of the second chop circuit 820. Outputs of the second chop circuit 820 may be coupled to output terminals of the PGA 800 and, further, to load devices and/or filter devices as may be desired (LOAD).

The chop circuits 810, 820 may configure orientation of signal flow about the amplifier A1. The chop circuits 810, 820 each may include an array of switches that selectively connect the inputs of the respective circuit to its outputs. Specifically, the first chop circuit 810 may include two pairs of switches controlled respectively by a control signal CI or CIB. One of the CI switches may connect an input terminal of the $C_{IP}$ capacitor to the $V_{IP}$ terminal and the other CI switch may connect an input terminal of $C_{IN}$ to the $V_{IN}$ terminal. One of the CIB switches may connect the input terminal of the $C_{IP}$ capacitor to the $V_{IN}$ terminal and the other CI switch may connect the input terminal of $C_{IN}$ to the $V_{IP}$ terminal. The CI and CIB control signals may operate in complementary fashion during chop phases of operation of the PGA 800 (described below).

Similarly, the second chop circuit 820 may include two pairs of switches controlled respectively by a control signal CO or COB. One of the CO switches may connect an output terminal 806 of the amplifier A1 to the VON terminal and the other CO switch may connect an output terminal 808 of the amplifier A1 to the VOP terminal. One of the COB switches may connect the output terminal 806 to the VOP terminal and the other COB switch may connect the output terminal 808 to the VON terminal. The CO and COB control signals may operate in complementary fashion during chop phases of operation of the PGA 800 (described below).

The capacitors $C_{IP}$, $C_{IN}$, $C_{FN}$ and $C_{FP}$ may be variable capacitors. That is, each capacitor $C_{IP}$, $C_{IN}$, $C_{FN}$ and $C_{FP}$ may include an array of switched capacitor devices (not shown). During operation, the capacitors $C_{IP}$, $C_{IN}$ may be set to have equal capacitance to each other and capacitors $C_{FN}$, $C_{FP}$ may be set to have equal capacitance to each other. A ratio of capacitances between the $C_{IP}/C_{IN}$ capacitors and the $C_{FN}/C_{FP}$ capacitors, however, may be controlled by control signals (not shown) to provide programmable gain of the PGA system 800.

The PGA 800 may include a pair of voltage sources $V_{ICM}$, $V_{CMA}$ coupled to the input capacitors $C_{IN}$, $C_{IP}$ by respective sampling switches. The voltage $V_{ICM}$ may be set to a common mode voltage of differential input signals that are presented at input terminals $V_{IP}$, $V_{IN}$ of the PGA 800. The voltage $V_{CMA}$ may be set to a common mode voltage of the amplifier A1. The first voltage source $V_{ICM}$ may be coupled to input terminals of the input capacitors $C_{IN}$, $C_{IP}$ via a pair of switches that close in response to a first control signal SMPL. The second voltage source $V_{CMA}$ may be coupled to output terminals of the input capacitors $C_{IP}$, $C_{IN}$ via second switches that close in response to a second control signal SMP.

The PGA 800 further may include a switch that connects the output terminals 806, 808 of the amplifier A1 together. The switch may be controlled by the same SMPL control signal that controls the switches that coupled the $V_{ICM}$ voltage source to the amplifier inputs.

The PGA 800 may include a controller 850 that generates control signals SMP, SMPL, CI, CIB, CO and COB to the PGA 800 in response to an external timing signal, such as a clock CLK signal.

In an embodiment, operation of the PGA 800 may proceed using the timing diagram of FIG. 2. During the CMS phase, the SMPL control signal may cause the $V_{ICM}$ voltage source to be connected to output terminals of the input capacitors $C_{IN}$, $C_{IP}$. The SMPL signal also may cause the amplifier outputs 806, 808 to be shorted together. Thus, the embodiment of FIG. 8 also corrects any voltage offsets that may be induced by operation of the amplifier A1.

When differential amplifiers are implemented in integrated circuits, their inputs typically include some offset voltage component that constitutes an error in the operation of the PGA 800. The shorting switch that is provided between the amplifier output terminals 806, 808 may combat the amplifier offset by shorting the amplifier output terminals 806, 808 together during the sampling phase CMS.

Assume that $C_{IN}=C_{IP}$ and $C_{FP}=C_{FN}$. When SMP signal causes its associated switches to be open, an offset of the amplifier A1 may cause a voltage error as $V_{ERR}=V_{OFF}(1+C_{IN}/C_{FN})$ to appear across the amplifier outputs 806, 808. Operation of the chopping circuits 810, 820 may average out the error at the PGA outputs VON, VOP, as long as the amplifier's headroom can accommodate the voltage error $V_{ERR}$ and the gained-up input signal. If the headroom penalty is significant, the error $V_{ERR}$ can be reduced by trimming the amplifier's offset.

Alternatively, the offset voltage $V_{OFF}$ of the amplifier can be reduced by autozeroing the amplifier during the common mode sampling phase. Several techniques are available to autozero an amplifier, including those described in C. Enz, et al., *Circuit Techniques for Reducing the Effects of Op-Amp Imperfections: Autozeroing, Correlated Double Sampling and Chopper Stabilization*, Proc. IEEE, vol. 84, no. 11 (November 1996). Typically, autozeroing an amplifier involves shorting the input of the amplifier, which is performed during the common mode sampling phases CMS of the embodiments discussed herein.

FIG. 8 illustrates an output-shorting switch the switch bridging the amplifier output terminals 806, 808 as applied to the PGA architecture of FIG. 1. The principles of the present invention may apply the shorting switch to other PGA architectures, for example, the PGA architectures shown in FIGS. 3 and 5.

FIG. 9

Figure 9:
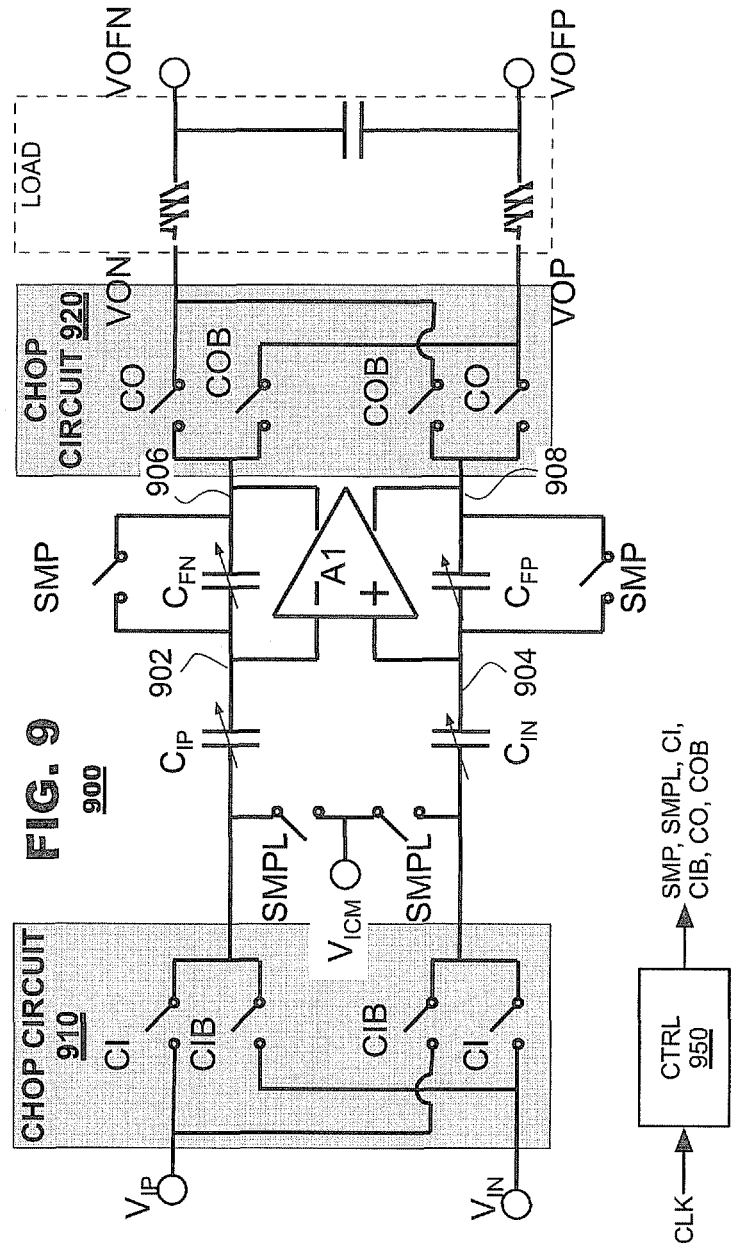
FIG. 9 illustrates a PGA according to a further embodiment of the present invention.

FIG. 9 illustrates a PGA 900 according to an embodiment of the present invention. The PGA 900 may include a differential amplifier A1, a pair of variable input capacitors $C_{IN}$, $C_{IP}$, a pair of variable feedback capacitors $C_{FN}$, $C_{FP}$ and two chop switch circuits 910, 920. A first chop circuit 910 may be provided on an input to the PGA 900 and a second chop circuit 920 may be provided on an output of the PGA 900. The first chop circuit 910 may connect a pair of differential input terminals $V_{IN}$, $V_{IP}$ of the PGA 900 respectively to input terminals of the input capacitors $C_{IN}$, $C_{IP}$. Output terminals of the input capacitors $C_{IN}$, $C_{IP}$ may be connected to input terminals of the amplifier A1. The feedback capacitors $C_{FN}$, $C_{FP}$ each may be coupled in a feedback configuration between respective amplifier outputs 906, 908 of the amplifier A1 and the amplifier's inputs. The amplifier outputs 906, 908 may be coupled to inputs of the second chop circuit 920. Outputs of the second chop circuit 920 may be coupled to output terminals VON, VOP of the PGA 900 and, further, to load devices and/or filter devices as may be desired (LOAD).

The chop circuits 910, 920 may configure orientation of signal flow about the amplifier A1. The chop circuits 910, 920 each may include an array of switches that selectively connect the inputs of the respective circuits to its outputs. Specifically, the first chop circuit 910 may include two pairs of switches controlled respectively by a control signal CI or CIB. One of the CI switches may connect an input terminal of the $C_{IP}$ capacitor to the $V_{IP}$ terminal and the other CI switch may connect an input terminal of $C_{IN}$ to the $V_{IN}$ terminal. One of the CIB switches may connect the input terminal of the $C_{IP}$ capacitor to the $V_{IN}$ terminal and the other CIB switch may connect the input terminal of $C_{IN}$ to the $V_{IP}$ terminal. The CI and CIB control signals may operate in complementary fashion during chop phases of operation of the PGA 900 (described below).

Similarly, the second chop circuit 920 may include two pairs of switches controlled respectively by a control signal CO or COB. One of the CO switches may connect an output terminal 906 of the amplifier A1 to the VON terminal and the other CO switch may connect an output terminal 908 of the amplifier A1 to the VOP terminal. The CO and COB control signals may operate in complementary fashion during chop phases of operation of the PGA 900 (described below).

The capacitors $C_{IP}$, $C_{IN}$, $C_{FN}$ and $C_{FP}$ may be variable capacitors. That is, each capacitor $C_{IP}$, $C_{IN}$, $C_{FN}$ and $C_{FP}$ may include an array of switched capacitor devices (not shown). During operation, the input capacitors $C_{IP}$, $C_{IN}$ may be set to have equal capacitance to each other and feedback capacitors $C_{FN}$, $C_{FP}$ may be set to have equal capacitance to each other. A ratio of capacitances between the $C_{IP}/C_{IN}$ capacitors and the $C_{FN}/C_{FP}$ capacitors, however, may be controlled by control signals (not shown) to provide programmable gain of the PGA system 900.

The PGA 900 may include a pair of shorting switches provided across the feedback capacitors $C_{FN}$, $C_{FP}$, which may be controlled by a common control signal SMP.

The PGA 900 may include a voltage source $V_{ICM}$ coupled to the input capacitors $C_{IN}$ $C_{IP}$) by respective sampling switches. The voltage $V_{ICM}$ may be set to a common mode voltage of differential input signals that are presented at input terminals $V_{IP}$, $V_{IN}$ of the PGA 900. The voltage source $V_{ICM}$ may be coupled to input terminals of the input capacitors $C_{IN}$, $C_{IP}$ via a pair of switches that close in response to a first control signal SMPL.

The PGA 900 may include a controller 950 that generates control signals SMP, SMPL, CI, CIB, CO and COB to the PGA 900 in response to an external timing signal, such as a clock CLK signal.

Control of the PGA 900 may proceed using the timing diagram illustrated in FIG. 2. During the CMS phase, the SMP and SMPL signals may cause their associated switches to be closed. In response, the input terminals of the input capacitors $C_{IP}$, $C_{IN}$ may be connected to the input common mode voltage $V_{ICM}$. The SMP switches may short the amplifier input terminals 902, 904 to corresponding amplifier output terminals 906, 908.

As in prior embodiments, autozeroing may occur during the CMS phase. However, during autozeroing, the amplifier A1 may be configured in unity feedback. From a common mode point of view, the amplifier configuration may cause the output common mode of the amplifier ($V_{CMO}$) to be forced at the input terminals 902, 904 of the amplifier A1. Hence, when SMP goes low, the input capacitors $C_{IP}$ and $C_{IN}$ may sample a common mode voltage $V_{ICM}$-$V_{CMO}$. In this regard, the PGA operation is similar to the implementation of FIG. 1 with $V_{CMA}$=$V_{CMO}$.

From a differential point of view, during the CMS phase, the amplifier A1 may force a voltage across its inputs close to the amplifier offset $V_{OFF}$. Hence, when SMP goes low, the input capacitors $C_{IP}$ and $C_{IN}$ sample a differential voltage close to $V_{OFF}$, which is then removed from the input voltage during the chop phases CHP1, CHP2. In practice, during the chop phases CHP1, CHP2, the amplifier output terminals 906, 908 have a constant small voltage error close to $V_{OFF}$, which can be removed at the PGA outputs VON, VOP by chopping.

In the scheme of FIG. 9, the common mode voltages at the input terminals 902, 904 and the output terminals 906, 908 of the amplifier A1 may be forced to the same voltage. However, this is not strictly a necessity. In another embodiment, the feedback capacitors $C_{FP}$ and $C_{FN}$ could be disconnected from the amplifier during the CMS phase and precharged to a desired common mode level shift voltage, as shown in FIG. 10.

FIGS. 10-11

Figure 10:
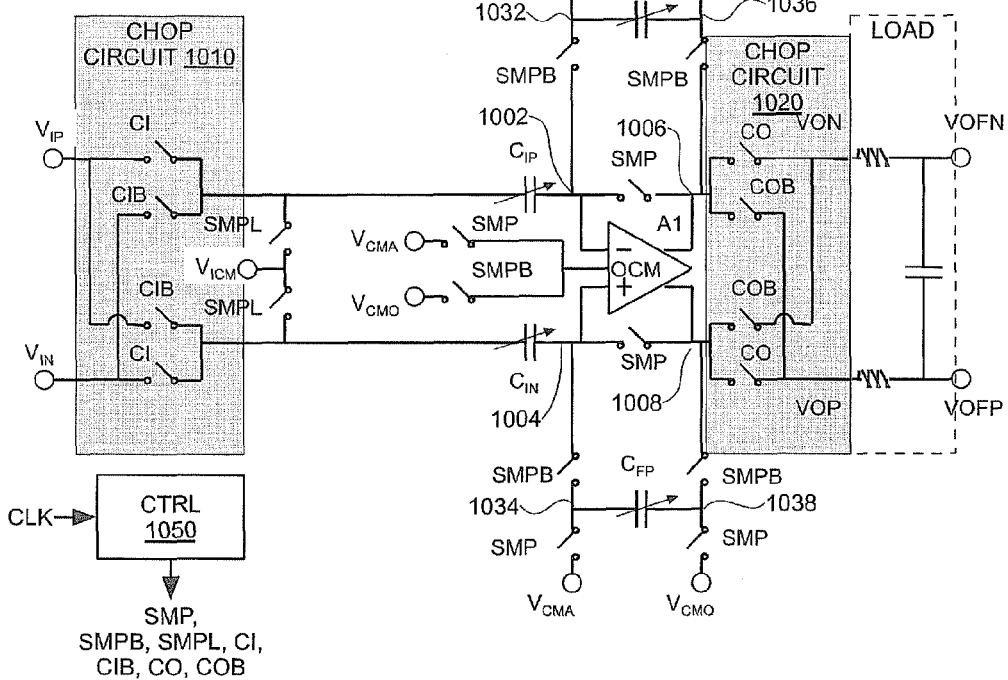
FIG. 10 illustrates a PGA according to another embodiment of the present invention.

FIG. 10 illustrates a PGA 1000 according to another embodiment of the present invention. The PGA 1000 may include a differential amplifier A1, a pair of variable input capacitors $C_{IN}$, $C_{IP}$, a pair of variable feedback capacitors $C_{FN}$, $C_{FP}$ and two chop switch circuits 1010, 1020. A first chop circuit 1010 may be provided on an input to the PGA 1000 and a second chop circuit 1020 may be provided on an output of the PGA 1000. The first chop circuit 1010 may connect a pair of differential input terminals $V_{IN}$, $V_{IP}$ of the PGA 1000 respectively to input terminals of the input capacitors $C_{IN}$, $C_{IP}$. Output terminals of the input capacitors $C_{IN}$, $C_{IP}$ may be connected to input terminals of the amplifier A1. The feedback capacitors $C_{FN}$, $C_{FP}$ each may be coupled in a feedback configuration between respective outputs 1006, 1008 of the amplifier A1 and the amplifier's inputs. The amplifier outputs 1006, 1008 may be coupled to inputs of the second chop circuit 1020. Outputs of the second chop circuit 1020 may be coupled to output terminals VON, VOP of the PGA 1000 and, further, to load devices and/or filter devices as may be desired (LOAD).

The chop circuits 1010, 1020 may configure orientation of signal flow about the amplifier A1. The chop circuits 1010, 1020 each may include an array of switches that selectively connect the inputs of the respective circuit to its outputs. Specifically, the first chop circuit 1010 may include two pairs of switches controlled respectively by a control signal CI or CIB. One of the CI switches may connect an input terminal of the $C_{IP}$ capacitor to the $V_{IP}$ terminal and the other CI switch may connect an input terminal of $C_{IN}$ to the $V_{IN}$ terminal. One of the CIB switches may connect the input terminal of the $C_{IP}$ capacitor to the $V_{IN}$ terminal and the other CIB switch may connect the input terminal of $C_{IN}$ to the $V_{IP}$ terminal. The CI and CIB control signals may operate in complementary fashion during chop phases of operation of the PGA 1000 (described below).

Similarly, the second chop circuit 1020 may include two pairs of switches controlled respectively by a control signal CO or COB. One of the CO switches may connect an output terminal 1006 of the amplifier A1 to the VON terminal and the other CO switch may connect an output terminal 1008 of the amplifier A1 to the VOP terminal. The CO and COB control signals may operate in complementary fashion during chop phases of operation of the PGA 1000 (described below).

The capacitors $C_{IP}$, $C_{IN}$, $C_{FN}$ and $C_{FP}$ may be variable capacitors. That is, each capacitor $C_{IP}$, $C_{IN}$, $C_{FN}$ and $C_{FP}$ may include an array of switched capacitor devices (not shown). During operation, the capacitors $C_{IP}$, $C_{IN}$ may be set to have equal capacitance to each other and capacitors $C_{FN}$, $C_{FP}$ may be set to have equal capacitance to each other. A ratio of capacitances between the $C_{IP}/C_{IN}$ capacitors and the $C_{FN}/C_{FP}$ capacitors, however, may be controlled by control signals (not shown) to provide programmable gain of the PGA 1000.

In the embodiment of FIG. 10, a pair of switches may couple the amplifier input terminals 1002, 1004 to respective output terminals 1006, 1008, which may be controlled by a SMP signal. The feedback capacitors $C_{FN}$, $C_{FP}$ may be coupled respectively to corresponding amplifier input terminals 1002, 1004 by a second pair of switches, which is controlled by a SMPB signal. The feedback capacitors $C_{FN}$, $C_{FP}$ also may be coupled respectively to a corresponding amplifier output terminal 1006, 1008 by a third pair of switches, which is controlled by the SMPB signal also.

The PGA 1000 may include a voltage source $V_{ICM}$ coupled to the input capacitors $C_{IN}$, $C_{IP}$ by respective sampling switches. The voltage $V_{ICM}$ may be set to a common mode voltage of differential input signals that are presented at input terminals $V_{IP}$, $V_{IN}$ of the PGA 1000. The voltage source $V_{ICM}$ may be coupled to input terminals of the input capacitors $C_{IN}$, $C_{IP}$ via a pair of switches that close in response to a first control signal SMPL.

The PGA 1000 may include a pair of amplifier common mode voltage sources, shown as $V_{CMA}$ and $V_{CMO}$ respectively. The $V_{CMA}$ voltage source may be set to the desired input common mode voltage of the amplifier A1. The $V_{CMO}$ voltage source may represent the desired output common mode of the amplifier A1 when the PGA 1000 is configured in gain/amplifying mode. The $V_{CMA}$ voltage source may be connected to an input terminal of the amplifier A1 that sets the output common mode voltage of the amplifier (labeled "OCM") by a switch controlled by the SMP signal. The $V_{CMO}$ voltage source may be connected to the OCM input of the amplifier A1 by a switch that is controlled by the SMPB signal.

The PGA 1000 may include a controller 1050 that generates control signals SMP, SMPB, SMPL, CI, CIB, CO and COB to the PGA 1000 in response to an external timing signal, such as a clock CLK signal.

Figure 11:
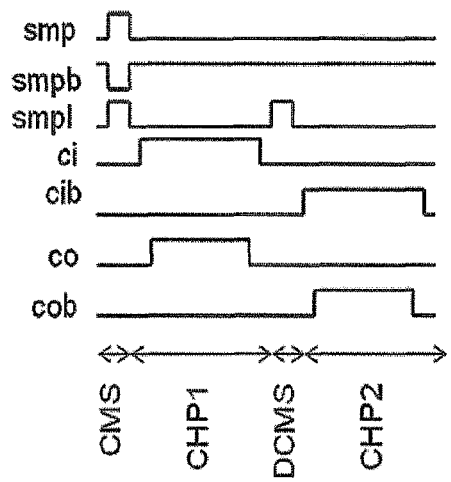
FIG. 11 is a timing diagram illustrating operation of the PGA of FIGS. 10 and 14 according to an embodiment of the present invention.

FIG. 11 is a timing diagram illustrating operation of the PGA 1000 according to an embodiment of the present invention. During the CMS phase, the SMPL switches may be closed, which may connect input terminals of the input capacitors $C_{IN}$, $C_{IP}$ to $V_{ICM}$. The SMP switches also may be closed, which may cause the input terminals 1002, 1004 of the amplifier A1 to be connected respectively to the amplifier output terminals 1006, 1008 of the amplifier A1. The amplifier A1, therefore, may cause its offset voltage to be presented at its input terminals 1002, 1004. An SMP switch also may connect the OCM terminal of the amplifier A1 to the $V_{CMA}$ voltage source.

The SMP signal also may cause first terminals 1032, 1034 of the feedback capacitors $C_{FN}$, $C_{FP}$ to be connected to the $V_{CMA}$ voltage and second terminals 1036, 1038 to be connected to the $V_{CMO}$ voltage. The SMPB signal may cause its associated switches to be open, which may ensure the feedback capacitors $C_{FP}$, $C_{FN}$ are disconnected from the input and output terminals 1002, 1004, 1006 and 1008 of the amplifier A1. Thus, during the CMS phase, the input capacitor $C_{IN}$ may sample a voltage $V_{ICM}-V_{CMA}-V_{OFF}/2$ and the input capacitors $C_{IP}$ may sample $V_{ICM}-V_{CMA}+V_{OFF}/2$. The sampling operation may define the amplifier input common mode for the amplifier A1, with an accommodation for amplifier offset, and retain the common mode voltage persistent at the amplifier's inputs during other phases of operation.

The switches of the chop circuits 1010, 1020 may be held open during the CMS phase, effectively disconnecting the capacitors $C_{IN}$, $C_{IP}$, $C_{FN}$ and $C_{FP}$ from other components of the PGA 1000.

During the first chop phase (CHP1), the chop circuits 1010, 1020 may be activated, the SMP, SMPL switches may be opened and the SMPB switches may be closed. The common mode voltage source $V_{ICM}$ may be disconnected from the input capacitors $C_{IN}$, $C_{IP}$ by the sample switches SMPL. The feedback capacitors $C_{FP}$, $C_{FN}$ may be connected to the amplifier terminals 1002, 1004, 1006 and 1008 by the SMPB switches. When SMPB goes high, the output common mode of amplifier A1 may be set to $V_{CMO}$. Because the feedback capacitors $C_{FP}$, $C_{FN}$ were precharged to voltages corresponding to the common mode voltage difference $V_{CMO}-V_{CMA}$, the feedback capacitors $C_{FP}$, $C_{FN}$ set the PGA output common mode voltage at $V_{CMO}$. In this embodiment, the feedback capacitors $C_{FP}$, $C_{FN}$ effectively level shift the common mode voltage, while the voltage offset stored on the input capacitors $C_{IN}$, $C_{IP}$ ensure that, for a zero input voltage, the PGA 1000 generates $V_{OFF}$ at the outputs 1006, 1008, not a gained up version of the offset voltage.

Also during the CHP1 phase, the CI control signal may cause its associated switches to be closed, thereby connecting the input signal at the $V_{IP}$ input to the input capacitor $C_{IP}$ and the input signal at the $V_{IN}$ input to the input capacitor $C_{IN}$. The CO control signal also may cause its associated switches to be closed, which may connect the feedback capacitor $C_{FN}$ to the output terminal VON and feedback capacitor $C_{FP}$ to the output terminal VOP. So configured, the PGA 1000 may amplify a differential input signal presented as input voltages $V_{IP}$, $V_{IN}$ based on a ratio of the input capacitors $C_{IP}/C_{IN}$ to the amplifier feedback capacitors $C_{FN}/C_{FP}$.

The differential signals input to the $V_{IP}$, $V_{IN}$ terminals may vary about the common mode voltage $V_{ICM}$ of the PGA's predecessor circuit (not shown). Application of the differential signals to the input capacitors $C_{IP}$, $C_{IN}$ may cause counterpart voltages to be applied to the inputs 1002, 1004 of the amplifier A1 but at a common mode voltage $V_{CMA}$ of the amplifier A1 due to the voltages sampled on the input capacitors $C_{IP}$, $C_{IN}$ during the CMS phase.

During the second chop phase (CHP2), configuration of the chop circuits 1010, 1020 may be inverted. The sample switches SMP, SMPL may remain open, keeping the common mode voltage sources $V_{ICM}$, $V_{CMA}$ disconnected from the input capacitors $C_{IN}$, $C_{IP}$. The feedback capacitors $C_{FP}$, $C_{FN}$ may remain connected to the amplifier terminals 1002, 1004, 1006 and 1008 by the SMPB switches. The CIB control signal may cause its associated switches to be closed, thereby connecting the signal at input $V_{IP}$ to the input capacitor $C_{IN}$ and the signal at input $V_{IN}$ to the input capacitor $C_{IP}$. In this manner, the chop circuit 1010 inverts distribution of the PGA input signals to the amplifier input terminals 1002, 1004 of the amplifier A1 as the PGA 1000 transitions from the CHP1 phase to the CHP2 phase and inverts the distribution again as the PGA 1000 transitions from the CHP2 phase to the CHP1 phase.

The COB control signal may cause its associated switches to be closed also, which may connect the amplifier output terminal 1006 to output terminal VOP and the amplifier output terminal 1008 to output terminal VON. As with the first chop circuit 1010, the second chop circuit 1020 may invert distribution of voltages from output terminals 1006, 1008 of the amplifier A1 to output terminals VON, VOP as the PGA 1000 transitions from the CHP1 phase to the CHP2 phase and inverts them again as the PGA 1000 transitions from the CHP2 phase to the CHP1 phase. Nevertheless, the PGA 1000 amplifies a differential input signal presented as input voltages $V_{IP}$, $V_{IN}$ based on a ratio of the input capacitors $C_{IP}/C_{IN}$ to the amplifier feedback capacitors $C_{FN}/C_{FP}$.

As in the CHP1 phase, during the CHP2 phase, the input voltages $V_{IP}$, $V_{IN}$ may vary about the common mode voltage $V_{ICM}$ of the PGA's predecessor circuit (not shown). Application of the $V_{IP}$, $V_{IN}$ input voltages to the input capacitors $C_{IN}$, $C_{IP}$ may cause counterpart voltages to be applied to inputs of the amplifier A1 but shifted to the common mode voltage $V_{CMA}$ of the amplifier A1 due to the voltages sampled on the input capacitors $C_{IN}$, $C_{IP}$ during the CMS phase. Thus, the PGA 1000 may perform a sampling operation during the CMS phase that may define a common mode for input signals presented to the amplifier A1 during the operational phases CHP1, CHP2 that matches to amplifier's common mode.

FIGS. 12-13

Figure 12:
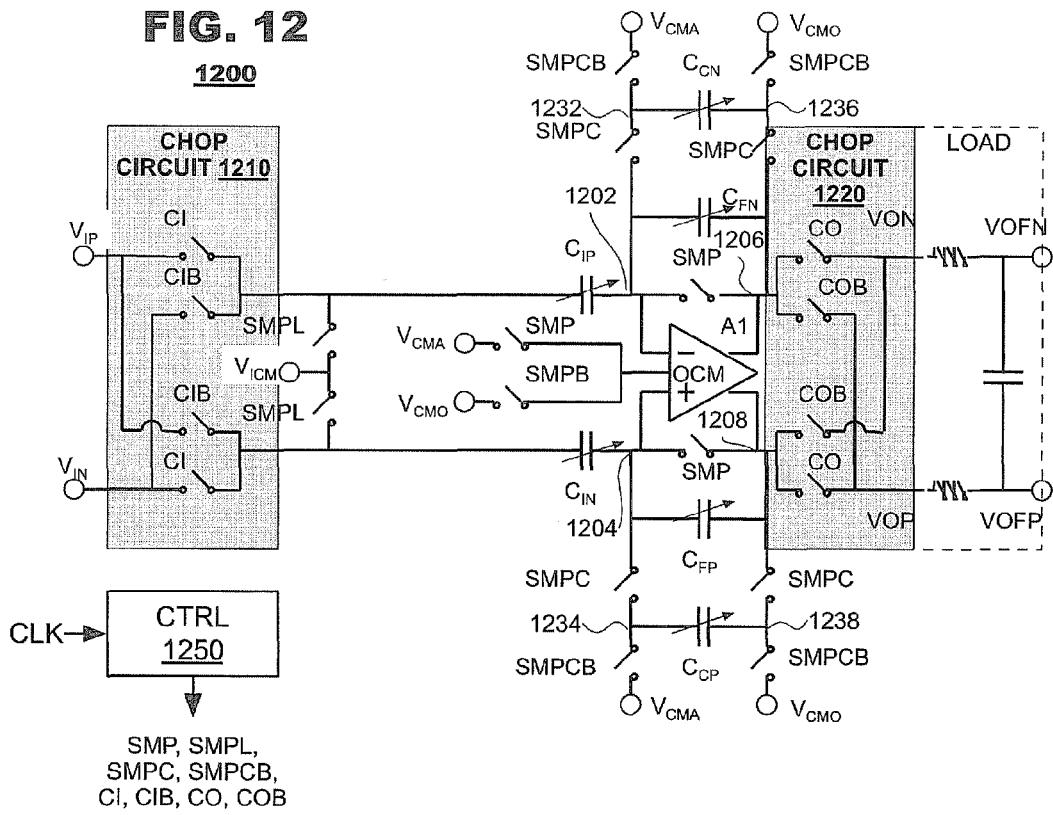
FIG. 12 illustrates a PGA according to a further embodiment of the present invention.

FIG. 12 illustrates a PGA 1200 according to another embodiment of the present invention. The PGA 1200 may include a differential amplifier A1, a pair of variable input capacitors $C_{IN}$, $C_{IP}$, a pair of variable feedback capacitors $C_{FN}$, $C_{FP}$, a pair of charging capacitors $C_{CN}$, $C_{CP}$ and two chop switch circuits 1210, 1220. A first chop circuit 1210 may be provided on an input to the PGA 1200 and a second chop circuit 1220 may be provided on an output of the PGA 1200. The first chop circuit 1210 may connect a pair of differential input terminals $V_{IN}$, $V_{IP}$ of the PGA 1200 respectively to input terminals of the input capacitors $C_{IN}$, $C_{IP}$. Output terminals of the input capacitors $C_{IN}$, $C_{IP}$ may be connected to input terminals 1202, 1204 of the amplifier A1. The feedback capacitors $C_{FN}$, $C_{FP}$ each may be coupled in a feedback configuration between respective amplifier outputs 1206, 1208 of the amplifier A1 and the amplifier input terminals 1202, 1204. The amplifier outputs 1206, 1208 may be coupled to inputs of the second chop circuit 1220. Outputs of the second chop circuit 1220 may be coupled to output terminals VON, VOP of the PGA 1200 and, further, to load devices and/or filter devices as may be desired (LOAD).

The chop circuits 1210, 1220 may configure orientation of signal flow about the amplifier A1. The chop circuits 1210, 1220 each may include an array of switches that selectively connect the inputs of the respective circuit to its outputs. Specifically, the first chop circuit 1210 may include two pairs of switches controlled respectively by a control signal CI or CIB. One of the CI switches may connect an input terminal of the $C_{IP}$ capacitor to the $V_{IP}$ terminal and the other CI switch may connect an input terminal of the $C_{IN}$ capacitor to the $V_{IN}$ terminal. One of the CIB switches may connect the input terminal of the $C_{IP}$ capacitor to the $V_{IN}$ terminal and the other CIB switch may connect the input terminal of the $C_{IN}$ capacitor to the $V_{IP}$ terminal. The CI and CIB control signals may operate in complementary fashion during chop phases of operation of the PGA 1200 (described below).

Similarly, the second chop circuit 1220 may include two pairs of switches controlled respectively by a control signal CO or COB. One of the CO switches may connect an output terminal 1206 of the amplifier A1 to the VON terminal and the other CO switch may connect an output terminal 1208 of the amplifier A1 to the VOP terminal. The CO and COB control signals may operate in complementary fashion during chop phases of operation of the PGA 1200 (described below).

The capacitors $C_{IP}$, $C_{IN}$, $C_{FN}$ and $C_{FP}$ may be variable capacitors. That is, each capacitor $C_{IP}$, $C_{IN}$, $C_{FN}$ and $C_{FP}$ may include an array of switched capacitor devices (not shown). During operation, the capacitors $C_{IP}$, $C_{IN}$ may be set to have equal capacitance to each other and capacitors $C_{FN}$, $C_{FP}$ may be set to have equal capacitance to each other. A ratio of capacitances between the $C_{IP}/C_{IN}$ capacitors and the $C_{FN}/C_{FP}$ capacitors, however, may be controlled by control signals (not shown) to provide programmable gain of the PGA 1200.

In the embodiment of FIG. 12, a pair of switches may couple the amplifier input terminals 1202, 1204 to respective output terminals 1206, 1208, which may be controlled by a SMP signal. The feedback capacitors $C_{FN}$, $C_{FP}$ may be provided with associated charging capacitors $C_{CN}$, $C_{CP}$. The feedback capacitors $C_{FN}$, $C_{FP}$ may be coupled between corresponding amplifier input terminals 1202, 1204 and output terminals 1206, 1208. The charging capacitors $C_{CN}$, $C_{CP}$ may be coupled to the feedback capacitors $C_{FN}$, $C_{FP}$ at nodes 1242, 1244, 1246, 1248 by switches that are controlled by an SMPC signal. The charging capacitors $C_{CN}$, $C_{CP}$ may be coupled to the $V_{CMA}$ and $V_{CMO}$ voltage sources as in the FIG. 10 embodiment by a second set of switches that are controlled by an SMPCB signal.

The PGA 1200 may include a voltage source $V_{ICM}$ coupled to the input capacitors $C_{IN}$, $C_{IP}$ by respective sampling switches. The voltage $V_{ICM}$ may be set to a common mode voltage of differential input signals that are presented at input terminals $V_{IP}$, $V_{IN}$ of the PGA 1200. The voltage source $V_{ICM}$ may be coupled to input terminals of the input capacitors $C_{IN}$, $C_{IP}$ via a pair of switches that close in response to a first control signal SMPL.

As in the prior embodiments, the PGA 1200 may include a pair of amplifier common mode voltage sources, shown as $V_{CMA}$ and $V_{CMO}$ respectively. The $V_{CMA}$ voltage source may be set to the desired input common mode voltage of the amplifier A1. The $V_{CMO}$ voltage source may represent the desired output common mode of the amplifier A1 when the PGA 1200 is configured in gain/amplifying mode. The $V_{CMA}$ voltage source may be connected to an input terminal OCM of the amplifier A1 that sets the output common mode voltage of the amplifier A1 by a switch controlled by the SMP signal. The $V_{CMO}$ voltage source may be connected to the OCM input of the amplifier A1 by a switch that is controlled by the SMPB signal.

The $V_{CMA}$ voltage source may be connected to first terminals 1232, 1234 of the feedback capacitors $C_{FN}$, $C_{FP}$ by respective switches, which may be controlled by the SMPCB signal. The $V_{CMO}$ voltage source may be connected to second terminals 1236, 1238 of the charging capacitors $C_{CN}$, $C_{CP}$ by respective switches, which may be controlled by the SMPCB signal also.

The PGA 1200 may include a controller 1250 that generates control signals SMP, SMPL, SMPC, SMPCB, CI, CIB, CO and COB to the PGA 1200 in response to an external timing signal, such as a clock CLK signal.

Figure 13:
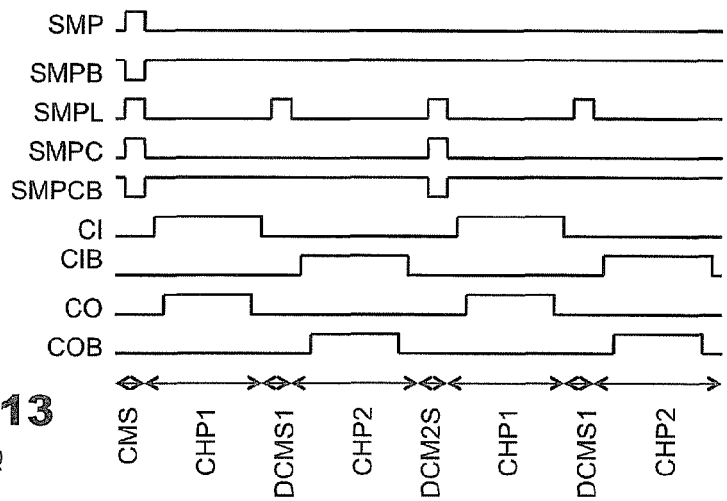
FIG. 13 is a timing diagram illustrating operation of the PGA of FIG. 12 according to an embodiment of the present invention.

FIG. 13 is a timing diagram illustrating operation of the PGA 1200 according to an embodiment of the present invention. During the CMS phase, the SMPL switches may be closed, which may connect input terminals of the input capacitors $C_{IN}$, $C_{IP}$ to $V_{ICM}$. The SMP switches also may be closed, which may cause the input terminals 1202, 1204 of the amplifier A1 to be connected respectively to the output terminals 1206, 1208 of the amplifier A1. The amplifier A1, therefore, may cause its offset voltage to be presented at its input terminals 1202, 1204. Further, voltages across the feedback capacitors $C_{FN}$ and $C_{FP}$ capacitors may be set to zero. An SMP switch also may connect the OCM terminal of the amplifier A1 to the $V_{CMA}$ voltage source.

The SMPC signal may cause its associated switches to be closed, which may connect the charging capacitors $C_{CN}$, $C_{CP}$ to the feedback capacitors $C_{FN}$, $C_{FP}$. Thus, voltages across the charging capacitors $C_{CN}$, $C_{CP}$ may be set to zero. The SMPCB signal may cause its associated switches to be open, which may ensure the feedback capacitors $C_{FP}$, $C_{FN}$ are disconnected from the $V_{CMA}$ and $V_{CMO}$ voltage sources. The switches of the chop circuits 1210, 1220 may be held open during the CMS phase, effectively disconnecting the capacitors $C_{IN}$, $C_{IP}$, $C_{FN}$ and $C_{FP}$ from other components of the PGA 1200. Thus, during the CMS phase, the input capacitor $C_{IN}$ may sample a voltage $V_{ICM}-V_{CMA}-V_{OFF}/2$ and the input capacitors $C_{IP}$ may sample $V_{ICM}-V_{CMA}+V_{OFF}/2$. The sampling operation may define the amplifier input common mode for the amplifier A1, with an accommodation for amplifier offset, and retain the common mode voltage persistent at the amplifier's inputs during other phases of operation.

During the first chop phase (CHP1), the chop circuits 1210, 1220 may be activated, the SMP, SMPL and SMPC switches may be opened and the SMPCB switches may be closed. The common mode voltage source $V_{ICM}$ may be disconnected from the input capacitors $C_{IN}$, $C_{IP}$ by the sample switches SMPL. The charging capacitors $C_{CN}$, $C_{CP}$ may be disconnected from the feedback capacitors $C_{FN}$, $C_{FP}$ and instead may be connected to the $V_{CMA}$ and $V_{CMO}$ voltage sources by the SMPCB switches.

Also during the CHP1 phase, the CI control signal may cause its associated switches to be closed, thereby connecting the input signal at the $V_{IP}$ input to the input capacitor $C_{IP}$ and the input signal at the $V_{IN}$ input to the input capacitor $C_{IN}$. The CO control signal also may cause its associated switches to be closed, which may connect the feedback capacitor $C_{FN}$ to the output terminal VON and feedback capacitor $C_{FP}$ to the output terminal VOP. So configured, the PGA 1200 may amplify a differential input signal presented as input voltages $V_{IP}$, $V_{IN}$ based on a ratio of the input capacitors $C_{IP}/C_{IN}$ to the amplifier feedback capacitors $C_{FN}/C_{FP}$.

The differential signals input to the $V_{IP}$, $V_{IN}$ terminals may vary about the common mode voltage $V_{ICM}$ of the PGA's predecessor circuit (not shown). Application of the differential signals to the input capacitors $C_{IP}$, $C_{IN}$ may cause counterpart voltages to be applied to the inputs 1202, 1204 of the amplifier A1 but at a common mode voltage $V_{CMA}$ of the amplifier A1 due to the voltages sampled on the input capacitors $C_{IP}$, $C_{IN}$ during the CMS phase.

During the second chop phase (CHP2), configuration of the chop circuits 1210, 1220 may be inverted. The sample switches SMP, SMPL may remain open, keeping the common mode voltage source. The charging capacitors $C_{CN}$, $C_{CP}$ may be connected to the $V_{CMA}$ and $V_{CMO}$ voltage sources by the SMPCB switches instead of the feedback capacitors $C_{FN}$, $C_{FP}$. The CIB control signal may cause its associated switches to be closed, thereby connecting the signal at input $V_{IP}$ to the input capacitor $C_{IN}$ and the signal at input $V_{IN}$ to the input capacitor $C_{IP}$. In this manner, the chop circuit 1210 inverts distribution of the PGA input signals to the input terminals 1202, 1204 of the amplifier A1 as the PGA 1200 transitions from the CHP1 phase to the CHP2 phase and inverts the distribution again as the PGA 1200 transitions from the CHP2 phase to the CHP1 phase.

The COB control signal may cause its associated switches to be closed also, which may connect the amplifier output terminal 1206 to output terminal VOP and the amplifier output terminal 1208 to output terminal VON. As with the first chop circuit 1210, the second chop circuit 1220 may invert distribution of voltages from output terminals 1206, 1208 of the amplifier A1 to output terminals VON, VOP as the PGA 1200 transitions from the CHP1 phase to the CHP2 phase and inverts them again as the PGA 1200 transitions from the CHP2 phase to the CHP1 phase. Nevertheless, the PGA 1200 amplifies a differential input signal presented as input voltages $V_{IP}$, $V_{IN}$ based on a ratio of the input capacitors $C_{IP}/C_{IN}$ to the amplifier feedback capacitors $C_{FN}/C_{FP}$.

As in the CHP1 phase, during the CHP2 phase, the input voltages $V_{IP}$, $V_{IN}$ may vary about the common mode voltage $V_{ICM}$ of the PGA's predecessor circuit (not shown). Application of the $V_{IP}$, $V_{IN}$ input voltages to the input capacitors $C_{IN}$, $C_{IP}$ may cause counterpart voltages to be applied to inputs of the amplifier A1 but shifted to the common mode voltage $V_{CMA}$ of the amplifier A1 due to the voltages sampled on the input capacitors $C_{IN}$, $C_{IP}$ during the CMS phase. Thus, the PGA 1200 may perform a sampling operation during the CMS phase that may define a common mode for input signals presented to the amplifier A1 during the operational phases CHP1, CHP2 that matches to amplifier's common mode.

In an embodiment, control signals CO and COB to the second chop circuit 1220 may have a shorter duration than the control signals CI and CIB that are input to the first chop circuit 1210. This may cause the output terminals VON, VOP to disconnect from output terminals of the amplifier A1 as the chop circuit transitions between the CHP1 and CHP2 phases and thereby reduces any glitches that otherwise might occur if the amplifier outputs were connected to the output terminals VON, VOP for the full duration of the CI, CIB signals.

In some cases, the CHP2 phase may follow the CHP1 phase immediately. Optionally, however, a "dummy common mode sampling" phase (DCMS) may be introduced between successive chop phases. Two types of dummy common mode sampling phases are shown in the embodiment of FIG. 13—DCMS1 and DCMS2 phases. During the DCMS1 phases, the SMPL signal may transition causing input terminals of the capacitors $C_{IP}$ and $C_{IN}$ to be connected to $V_{ICM}$. Closing the SMPL switches may cause the amplifier output to go to zero, which may cause output voltages at the onset of the next chop phase (CHP2) to have the same initial conditions as at the onset of the prior chop phase (CHP1).

During the DCMS2 phases, the SMPL and SMPC signals may cause their associated switches to be closed while the SMPCB signal may cause its associated switches to be open. During this phase, the input terminals of the capacitors $C_{IN}$, $C_{IP}$ may be connected to $V_{ICM}$. The charging capacitors $C_{CN}$, $C_{CP}$ may be connected respectively to the feedback capacitors $C_{FP}$, $C_{FN}$. The charging capacitors $C_{CN}$, $C_{CP}$ had been charged to a voltage representing a difference between $V_{CMA}$ and $V_{CMO}$ and inject charge representing this voltage to the PGA 1200. In this manner, the PGA architecture can introduce a common mode level shift between the inputs of the amplifier A1 and its outputs.

Over the course of several DCMS phases, the charging capacitors may deliver a common mode charge to the feedback capacitors $C_{FP}$ and $C_{FN}$ that gradually increases the common mode voltage across the feedback capacitors $C_{FP}$ and $C_{FN}$. $C_{CP}$ and $C_{CP}$ may be charged to a common mode level shift voltage $V_{CMO}-V_{CMA}$ and may deliver the common mode charge to $C_{FP}$ and $C_{FN}$ during the DCMS phase. In order to reject kT/C noise that might be introduced when $C_{CN}$ and $C_{CP}$ are sampled, a CHP1 phase and a CHP2 phase may follow before $C_{CN}$ and $C_{CP}$ are sampled again. If the kT/C noise introduced by $C_{CN}$ and $C_{CP}$ is negligible, they could be sampled every DCMS phase. Further, during the CMS phase, $C_{CN}$ and $C_{CP}$ may stay idle, since $C_{FP}$ and $C_{FN}$ are shorted out by the switches driven by SMP.

FIG. 14

Figure 14:
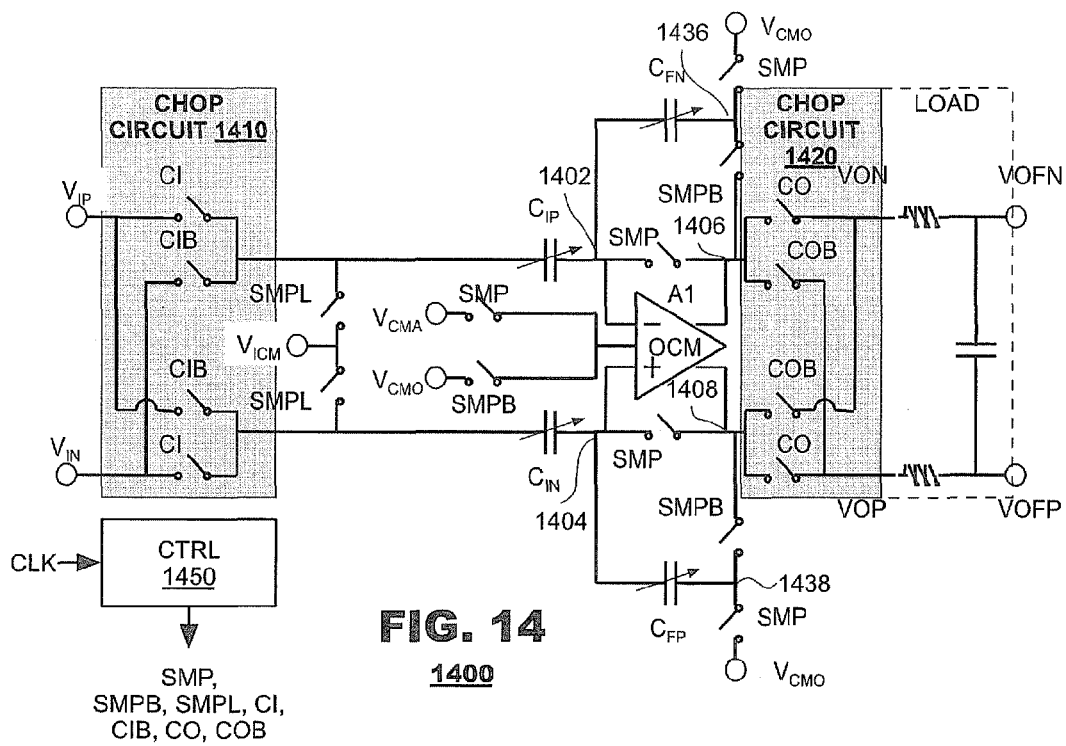
FIG. 14 illustrates a PGA according to another embodiment of the present invention.

FIG. 14 illustrates a PGA 1400 according to another embodiment of the present invention. The PGA 1400 may include a differential amplifier A1, a pair of variable input capacitors $C_{IN}$, $C_{IP}$, a pair of variable feedback capacitors $C_{FN}$, $C_{FP}$ and two chop switch circuits 1410, 1420. A first chop circuit 1410 may be provided on an input to the PGA 1400 and a second chop circuit 1420 may be provided on an output of the PGA 1400. The first chop circuit 1410 may connect a pair of differential input terminals $V_{IN}$, $V_{IP}$ of the PGA 1400 respectively to input terminals of the input capacitors $C_{IN}$, $C_{IP}$. Output terminals of the input capacitors $C_{IN}$, $C_{IP}$ may be connected to input terminals 1402, 1404 of the differential amplifier A1. The feedback capacitors $C_{FN}$, $C_{FP}$ each may be coupled in a feedback configuration between respective outputs 1406, 1408 of the differential amplifier A1 and the amplifier input terminals 1402, 1404. The amplifier outputs 1406, 1408 may be coupled to inputs of the second chop circuit 1420. Outputs of the second chop circuit 1420 may be coupled to output terminals VON, VOP of the PGA 1400 and, further, to load devices and/or filter devices as may be desired (LOAD).

The chop circuits 1410, 1420 may configure orientation of signal flow about the amplifier A1. The chop circuits 1410, 1420 each may include an array of switches that selectively connect the inputs of the respective circuit to its outputs. Specifically, the first chop circuit 1410 may include two pairs of switches controlled respectively by a control signal CI or CIB. One of the CI switches may connect an input terminal of the $C_{IP}$ capacitor to the $V_{IP}$ terminal and the other CI switch may connect an input terminal of the $C_{IP}$ capacitor to the $V_{IN}$ terminal. One of the CIB switches may connect the input terminal of the $C_{IN}$ capacitor to the $V_{IN}$ terminal and the other CI switch may connect the input terminal of the $C_{IN}$ capacitor to the $V_{IP}$ terminal. The CI and CIB control signals may operate in complementary fashion during chop phases of operation of the PGA 1400 (described below).

Similarly, the second chop circuit 1420 may include two pairs of switches controlled respectively by a control signal CO or COB. One of the CO switches may connect an output terminal 1406 of the amplifier A1 to the VON terminal and the other CI switch may connect an output terminal 1408 of the amplifier A1 to the VOP terminal. The CO and COB control signals may operate in complementary fashion during chop phases of operation of the PGA 1400 (described below).

The capacitors $C_{IP}$, $C_{IN}$, $C_{FN}$ and $C_{FP}$ may be variable capacitors. That is, each capacitor $C_{IP}$, $C_{IN}$, $C_{FN}$ and $C_{FP}$ may include an array of switched capacitor devices (not shown). During operation, the capacitors $C_{IP}$, $C_{IN}$ may be set to have equal capacitance to each other and capacitors $C_{FN}$, $C_{FP}$ may be set to have equal capacitance to each other. A ratio of capacitances between the $C_{IP}/C_{IN}$ capacitors and the $C_{FN}/C_{FP}$ capacitors, however, may be controlled by control signals (not shown) to provide programmable gain of the PGA 1400.

In the embodiment of FIG. 14, a pair of switches may couple the amplifier input terminals 1402, 1404 to respective output terminals 1406, 1408, which may be controlled by a SMP signal. Terminals 1436, 1438 of the feedback capacitors $C_{FN}$, $C_{FP}$ may be coupled to output terminals 1406, 1408 of the amplifier A1 by respective switches that are controlled by an SMPB signal. The terminals 1436, 1438 of the feedback capacitors $C_{FN}$, $C_{FP}$ also may be coupled to a $V_{CMO}$ voltage source by respective switches that may be controlled by the SMP signal. Again, the $V_{CMO}$ voltage source may represent the desired output common mode voltage of the amplifier A1 when the PGA 1400 is configured in gain/amplifying mode mode.

As in the prior embodiments, the PGA 1400 may include a pair of amplifier common mode voltage sources, shown as $V_{CMA}$ and $V_{CMO}$ respectively. The $V_{CMA}$ voltage source may be set to the desired input common mode voltage of the amplifier A1. The $V_{CMO}$ voltage source may represent the desired output common mode of the amplifier A1 when the PGA 1400 is configured in gain/amplifying mode. The $V_{CMA}$ voltage source may be connected to an input terminal OCM of the amplifier A1 that sets the output common mode voltage of the amplifier A1 by a switch controlled by the SMP signal. The $V_{CMO}$ voltage source may be connected to the OCM input of the amplifier A1 by a switch that is controlled by the SMPB signal.

The PGA 1400 may include a controller 1450 that generates control signals SMP, SMPB, SMPL, CI, CIB, CO and COB to the PGA 1400 in response to an external timing signal, such as a clock CLK signal.

In an embodiment, operation of the PGA 1400 may proceed using the timing diagram of FIG. 11. During the CMS phase, the SMPL signal may cause their associated switches to be closed, which cause input terminals of the input capacitors $C_{IP}$, $C_{IN}$ to be connected to the common mode voltage $V_{ICM}$. The SMP signal may cause its associated switches to be closed, which may short the input terminals 1402, 1404 of the amplifier A1 to their respective output terminals 1406, 1408. Further, terminals 1436, 1438 of the feedback capacitors may be connected to the $V_{CMO}$ voltage source. The SMPB signal may cause its associated switches to be open, which disconnects the terminals 1436, 1438 of the feedback capacitors $C_{FN}$, $C_{FP}$ from the output terminals 1406, 1408 of the amplifier A1. An SMP switch also may connect the OCM terminal of the amplifier A1 to the $V_{CMA}$ voltage source.

This PGA 1400 of FIG. 14 offers better offset cancellation than the PGA architectures of FIG. 9, 10 or 12. In the prior embodiments, a PGA zero input signal, namely $V_{IP}=V_{IN}$, would result in an offset voltage at the output of A1 of approximately $V_{OFF}$, where $V_{OFF}$ is the input referred offset of the amplifier A1. In the PGA 1400 of FIG. 14, however, a zero input signal ($V_{IP}=V_{IN}$,) may result in a zero voltage across the output terminals 1406, 1408 of amplifier A1.

As per the scheme of FIG. 9, the PGA 1400 of FIG. 14 naturally sets the input common mode voltage at the input terminals 1402, 1404 of the amplifier A1 ($V_{CMA}$) to the output common mode $V_{CMO}$ of the amplifier A1. If a $V_{CMA}$ voltage different from $V_{CMO}$ is desired, during the CMS phase the output common mode voltage of the amplifier A1 could be set to the desired $V_{CMA}$.

The foregoing description has presented various architectures to sample input common mode voltages (FIGS. 1, 3 and 5) and amplifier common mode voltages (FIGS. 8-10, 12, 14) in a PGA. Although FIGS. 8-10, 12, 14 illustrate PGAs that employ $V_{ICM}$ sampling techniques of FIG. 1, the principles of the present invention also permit the $V_{ICM}$ sampling techniques of FIGS. 3 and 5 to the PGA architectures of FIGS. 8-10, 12, 14.

Several embodiments of the invention are specifically illustrated and/or described herein. However, it will be appreciated that modifications and variations of the invention are covered by the above teachings and within the purview of the appended claims without departing from the spirit and intended scope of the invention.

We claim:
1. A programmable gain amplifier ("PGA"), comprising:
a differential amplifier having a pair of inputs and a pair of outputs,
a pair of input capacitors having output terminals connected respectively to inputs of the differential amplifier,
a pair of feedback capacitors connected respectively between outputs of the differential amplifier and corresponding inputs of the differential amplifier,
a first cross-coupled chop circuit connecting the input capacitors to respective input terminals of the PGA,
a second cross-coupled chop circuit connecting the output terminals of the differential amplifier to respective output terminals of the PGA, and a voltage source coupled to input terminals of the differential amplifier via respective switches, having a voltage set to a common mode voltage of the differential amplifier.

2. The PGA of claim 1, further comprising a second voltage source coupled to input terminals of the input capacitors via respective switches, having a voltage set to a common mode of signals to be input to the PGA.

3. The PGA of claim 1, wherein
each input capacitor is provided as a pair of equally weighted sub-capacitors, and
the first chop circuit comprises four pairs of switches, one pair provided for each of the sub-capacitors, one of the switches in each pair coupling the respective sub-capacitor to a first PGA input and the other of the switches in each pair coupling the respective sub-capacitor to a second PGA input.

4. The PGA of claim 1, further comprising a shorting switch coupled between input terminals of the two input capacitors.

5. The PGA of claim 1, further comprising a shorting switch coupled between output terminals of the differential amplifier.

6. The PGA of claim 1, further comprising a controller to manage switch configurations of the PGA, the controller cycling the PGA through several phases of operation:
a common mode sampling phase during which the input capacitors sample voltages representing a difference between a common mode voltage of input signals to the PGA and the common mode voltage of the differential amplifier,
a first chop phase during which the first and second chop circuits configure propagation of input signals about the differential amplifier in a first orientation, and
a second chop phase during which the first and second chop circuits configure propagation of input signals about the differential amplifier in a second orientation, inverse of the first orientation.

7. The PGA of claim 6, further comprising wherein the controller manages switch configurations for another phase of operation in which the input capacitors are presented with the common mode voltage of the input signals but not the common mode voltage of the differential amplifier.

8. The PGA of claim 1, wherein the differential amplifier is an autozeroing amplifier.

9. The PGA of claim 1, wherein the differential amplifier is a trimmed amplifier.

10. A programmable gain amplifier ("PGA"), comprising:
a differential amplifier having a pair of inputs and a pair of outputs,
a pair of input capacitors having output terminals connected respectively to inputs of the differential amplifier,
a pair of feedback capacitors connected respectively between outputs of the differential amplifier and corresponding inputs of the differential amplifier,
a first cross-coupled chop circuit connecting the input capacitors to respective input terminals of the PGA,
a second cross-coupled chop circuit connecting the output terminals of the differential amplifier to respective output terminals of the PGA, and
a voltage source coupled to input terminals of the input capacitors via respective switches, having a voltage set to a common mode voltage of an input signal to be presented to the PGA.

11. The PGA of claim 10, further comprising a second voltage source coupled to input terminals of the differential amplifier via respective switches, having a voltage set to a common mode voltage of the differential amplifier.

12. The PGA of claim 10, further comprising a shorting switch connected between output terminals of the differential amplifier.

13. The PGA of claim 10, further comprising a pair of shorting switches, each switch connected between a respective output terminal of the differential amplifier and a respective input terminal of the differential amplifier.

14. The PGA of claim 13, further comprising:
connecting switches coupling the feedback capacitors respectively to input and output terminals of the differential amplifier, the connecting switches being controlled in inverse fashion to the shorting switches, and
a pair of reference voltages corresponding respectively to an input common mode of the differential amplifier and to an output common mode voltage of the differential amplifier and coupled to respective terminals of the feedback capacitors via respective switches.

15. The PGA of claim 13, further comprising
a pair of charging capacitors provided in correspondence with the feedback capacitors,
switches to connect terminals of the feedback capacitors to corresponding terminals of the feedback capacitors, the connecting switches being controlled in inverse fashion to the shorting switches, and
a pair of reference voltages corresponding respectively to an input common mode of the differential amplifier and to an output common mode voltage of the differential amplifier and coupled to respective terminals of the charging capacitors via respective switches.

16. The PGA of claim 10, further comprising
connecting switches coupling the feedback capacitors respectively to output terminals of the differential amplifier, the connecting switches being controlled in inverse fashion to the shorting switches, and
a reference voltage corresponding respectively to a common mode output voltage of the differential amplifier and coupled to a terminal of the feedback capacitors via respective switches.

17. The PGA of claim 10, wherein the differential amplifier is an autozeroing amplifier.

18. The PGA of claim 10, wherein the differential amplifier is a trimmed amplifier.

19. A programmable gain amplifier ("PGA"), comprising:
a differential amplifier having a pair of inputs and a pair of outputs,
a pair of input capacitors connected respectively to inputs of the differential amplifier,
a pair of feedback capacitors connected respectively between outputs of the differential amplifier and corresponding inputs of the differential amplifier,
a first chop circuit connecting the input capacitors to respective input terminals of the PGA,
a second chop circuit connecting the output terminals of the differential amplifier to respective output terminals of the PGA, and
means for sampling voltages across the input capacitors when the second chop circuit is disabled, the sampled voltages corresponding to a difference between a common mode voltage of signals input to the PGA and a common mode voltage of the differential amplifier.

20. A programmable gain amplifier ("PGA"), comprising:
a differential amplifier having a pair of inputs and a pair of outputs,
a pair of input capacitors connected respectively to inputs of the differential amplifier, a pair of feedback capacitors connected respectively between outputs of the differential amplifier and corresponding inputs of the differential amplifier, a first chop circuit connecting the input capacitors to respective input terminals of the PGA, a second chop circuit connecting the output terminals of the differential amplifier to respective output terminals of the PGA, and means for presenting a voltage at input terminals of the input capacitors corresponding to a common mode voltage of signals input to the PGA when the second chop circuit is disabled, and means for presenting a voltage at input terminals of the amplifier corresponding to an offset-compensated common mode voltage of the amplifier when the second chop circuit is disabled.

21. A method of controlling a chopped capacitor-based programmable gain amplifier, comprising:

in a common mode sampling phase of operation, sampling a voltage across input capacitors of the PGA corresponding to a difference between a common mode voltage of input signals to be input to the PGA and a common mode voltage of a differential amplifier within the PGA, in a first chop phase of operation, controlling chop circuits within the PGA to propagate a differential input signal from input terminals of the PGA to output terminals of the PGA, the input signal having a first orientation with respect to the differential amplifier, in a second chop phase of operation, controlling the chop circuits within the PGA to propagate the differential input signal from the input terminals of the PGA to the output terminals of the PGA, the input signal having a second orientation with respect to the differential amplifier inverse of the first orientation, wherein sampling is terminated at an end of the first phase.

22. The method of claim 21, further comprising repeating the first and second chop phases without use of another common mode sampling phase.

23. The method of claim 21, further comprising, in a dummy sampling phase that occurs between the first and second chop phases, presenting an input common mode signal to the input capacitors.

24. The method of claim 23, wherein the common mode sampling phase and the dummy sampling phase have common duration.

* * * * *